United States Patent
Itai et al.

(10) Patent No.: US 10,984,981 B2
(45) Date of Patent: Apr. 20, 2021

(54) CHARGED PARTICLE BEAM DEVICE HAVING INSPECTION SCAN DIRECTION BASED ON SCAN WITH SMALLER DOSE

(71) Applicant: Hitachi High-Tech Corporation, Tokyo (JP)

(72) Inventors: Hideki Itai, Tokyo (JP); Kumiko Shimizu, Tokyo (JP); Wataru Mori, Tokyo (JP); Hajime Kawano, Tokyo (JP); Shahedul Hoque, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/118,891

(22) Filed: Aug. 31, 2018

(65) Prior Publication Data

US 2018/0374674 A1    Dec. 27, 2018

Related U.S. Application Data

(62) Division of application No. 15/329,468, filed as application No. PCT/JP2015/071186 on Jul. 27, 2015, now abandoned.

(30) Foreign Application Priority Data

Jul. 31, 2014 (JP) ................. 2014-155678
Jul. 31, 2014 (JP) ................. 2014-155679
Jul. 31, 2014 (JP) ................. 2014-155680

(51) Int. Cl.
*H01J 37/147* (2006.01)
*H01J 37/28* (2006.01)
*H01J 37/22* (2006.01)

(52) U.S. Cl.
CPC ............ *H01J 37/28* (2013.01); *H01J 37/147* (2013.01); *H01J 37/1474* (2013.01);
(Continued)

(58) Field of Classification Search
None
See application file for complete search history.

(56) References Cited

U.S. PATENT DOCUMENTS 5,276,325 A    1/1994    Todokoro et al.
6,879,719 B1   4/2005    Conrad et al.
(Continued)

FOREIGN PATENT DOCUMENTS

JP    5-74399 A      3/1993
JP    2010-272398 A  12/2010
(Continued)

OTHER PUBLICATIONS

Jain et al., Machine Vision (1995) (Year: 1995).*
(Continued)

*Primary Examiner* — James Choi
(74) *Attorney, Agent, or Firm* — Crowell & Moring LLP

(57) ABSTRACT

A charged particle beam device is provided which minimizes the beam irradiation amount while maintaining a high measurement success rate. The charged particle beam device includes a control device for controlling a scan deflector on the basis of selection of a predetermined number n of frames, wherein the control device controls the scan deflector so that a charged particle beam is selectively scanned on a portion on a sample corresponding to a pixel satisfying a predetermined condition or a region including the portion on the sample from an image obtained by scanning the charged particle beam for a number m of frames (m≥1), the number m of frames being smaller than the number n of frames.

18 Claims, 16 Drawing Sheets

(52) U.S. Cl.
CPC ......... *H01J 37/22* (2013.01); *H01J 2237/221* (2013.01); *H01J 2237/2806* (2013.01); *H01J 2237/2817* (2013.01)

(56) References Cited

U.S. PATENT DOCUMENTS

| | | | | |
|---|---|---|---|---|
| 9,466,463 | B1* | 10/2016 | Lam | H01J 37/28 |
| 2005/0121610 | A1* | 6/2005 | Abe | G01N 23/2251 |
| | | | | 250/310 |
| 2009/0087103 | A1* | 4/2009 | Abe | G06K 9/6203 |
| | | | | 382/209 |
| 2009/0290809 | A1* | 11/2009 | Yamada | H04N 5/23248 |
| | | | | 382/266 |
| 2012/0153145 | A1 | 6/2012 | Cheng et al. | |
| 2013/0306866 | A1* | 11/2013 | Hoque | H01J 37/1474 |
| | | | | 250/310 |

FOREIGN PATENT DOCUMENTS

| | | |
|---|---|---|
| JP | 2013-185852 A | 9/2013 |
| WO | WO 2011/016208 A1 | 2/2011 |

OTHER PUBLICATIONS

International Search Report (PCT/ISA/210) issued in PCT Application No. PCT/JP2015/071186 dated Oct. 27, 2015 with English translation (Ten (10) pages).
Japanese-language Written Opinion (PCT/ISA/237) issued in PCT Application No. PCT/JP2015/071186 dated Oct. 27, 2015 (Seven (7) pages).

* cited by examiner

[Fig. 1]
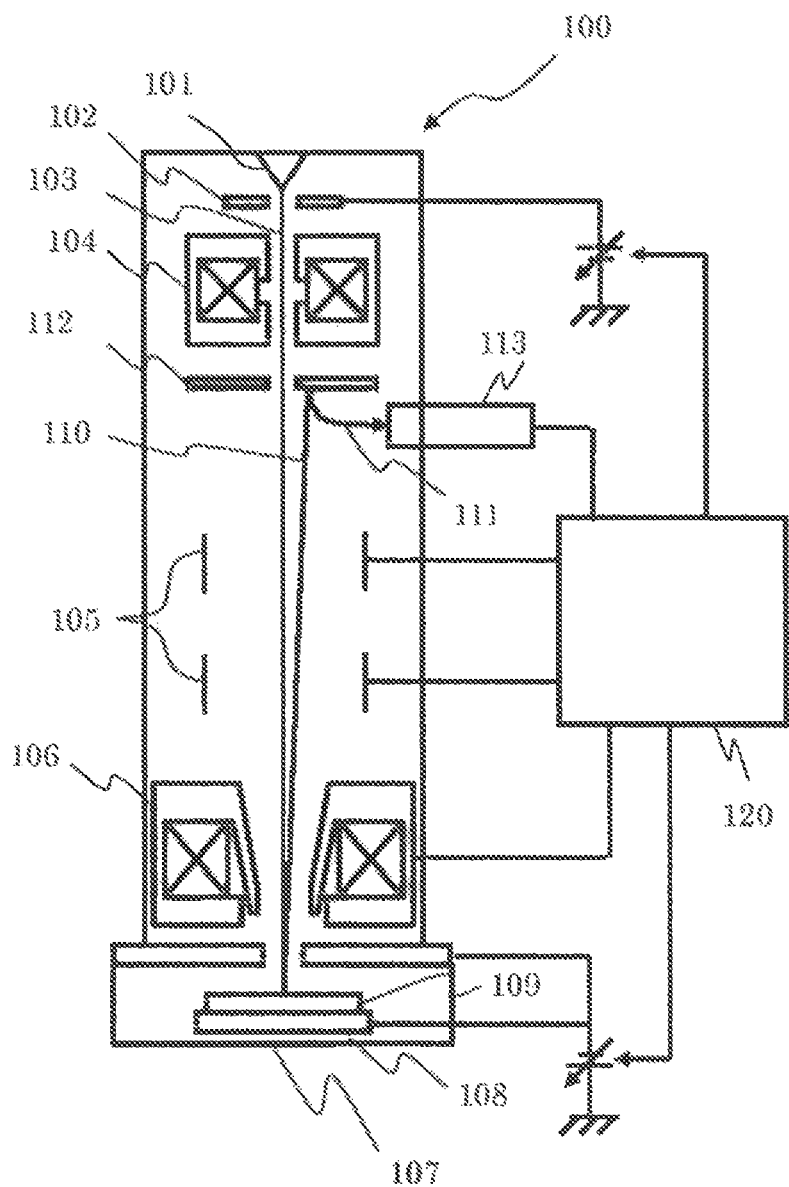

[Fig. 2]
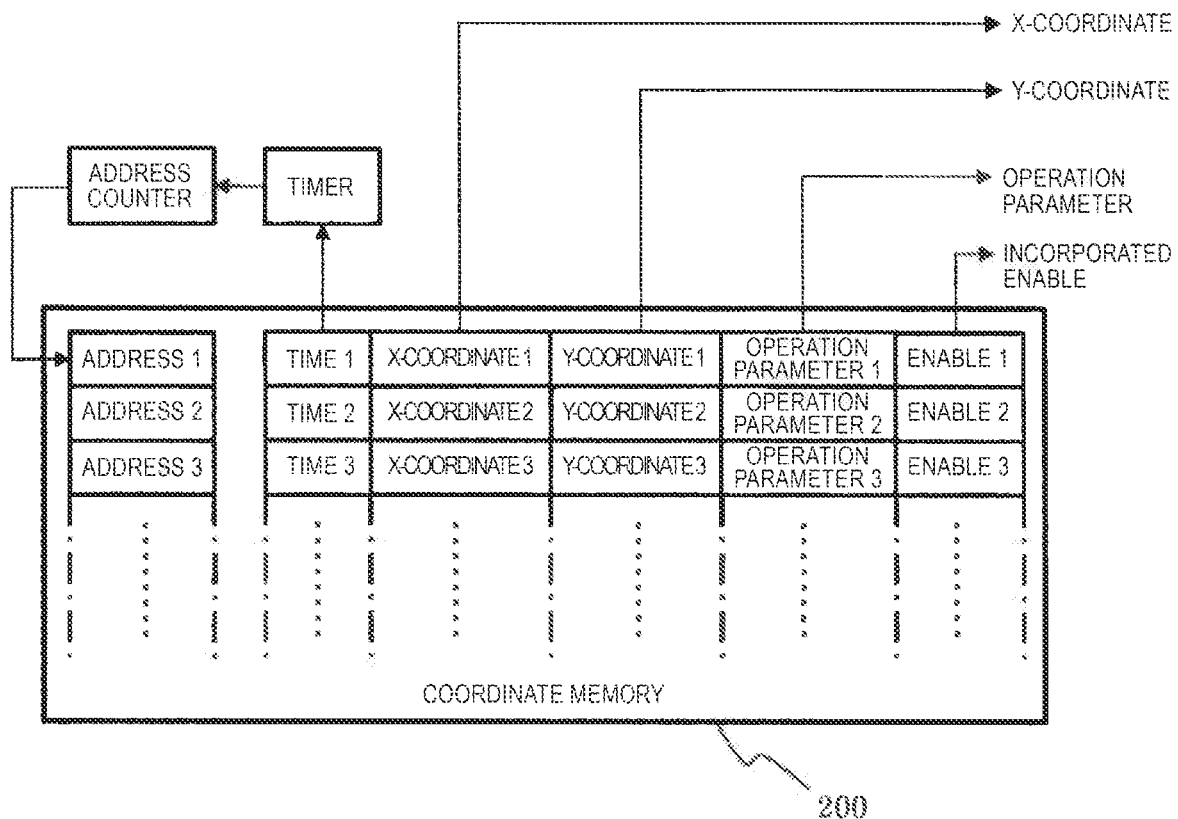

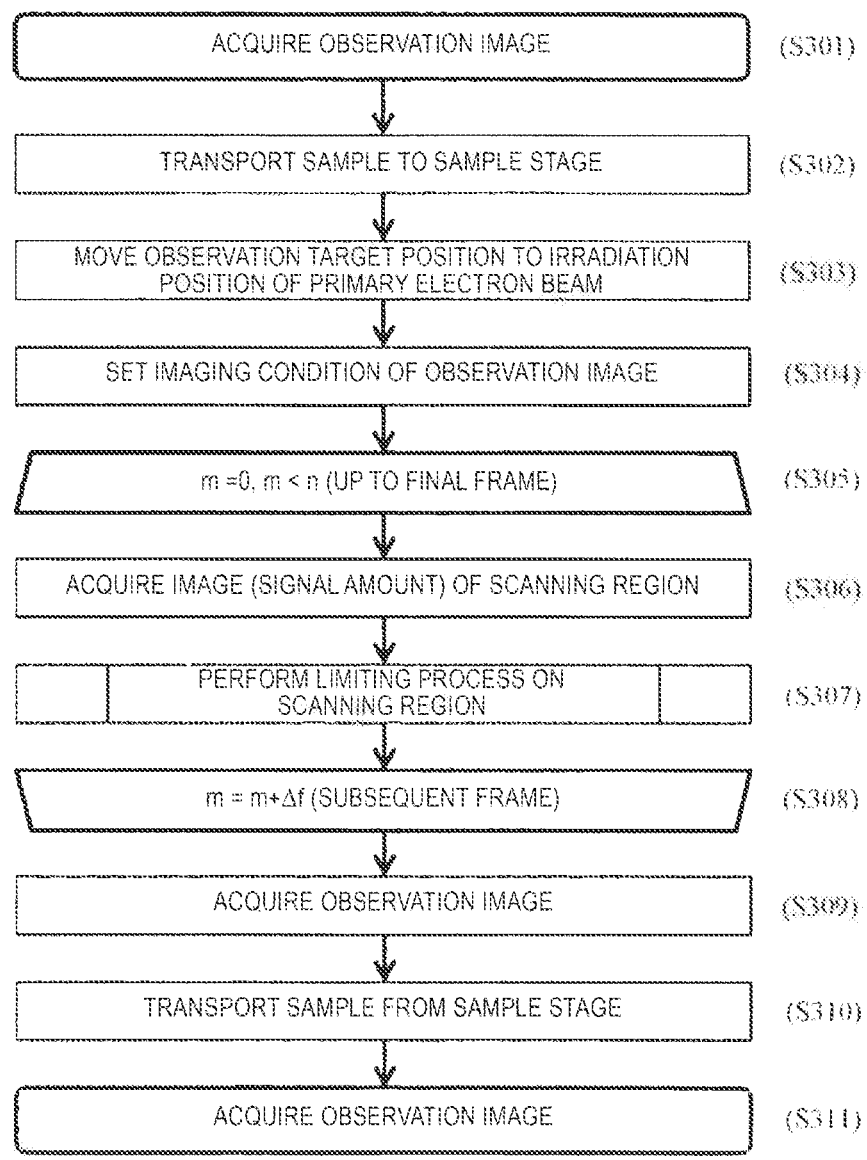

[Fig. 4]
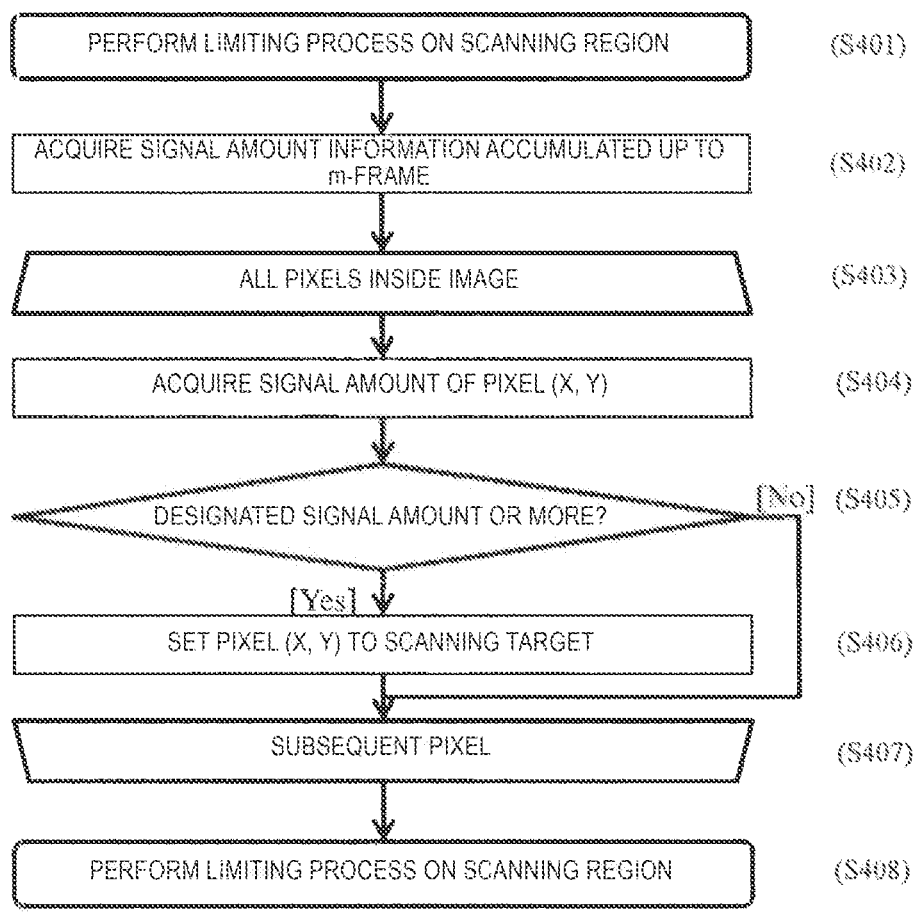

[Fig. 5]
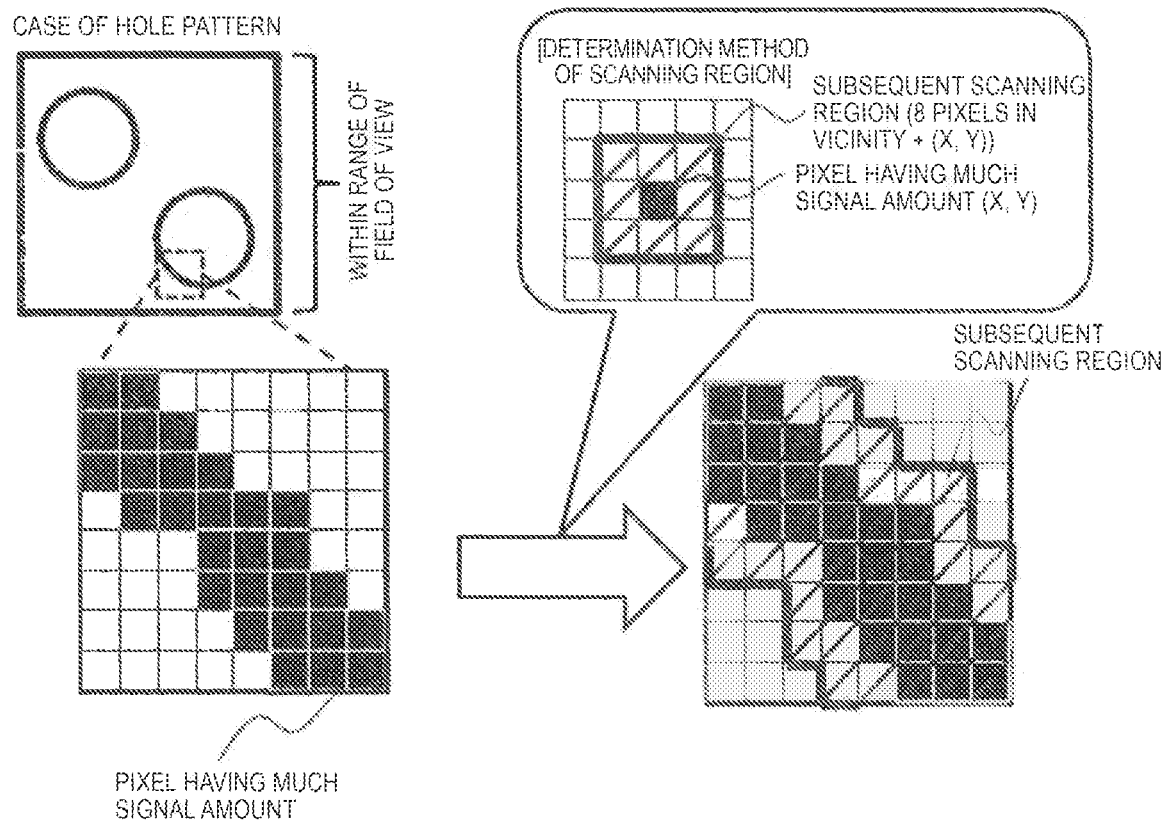

[Fig. 6]
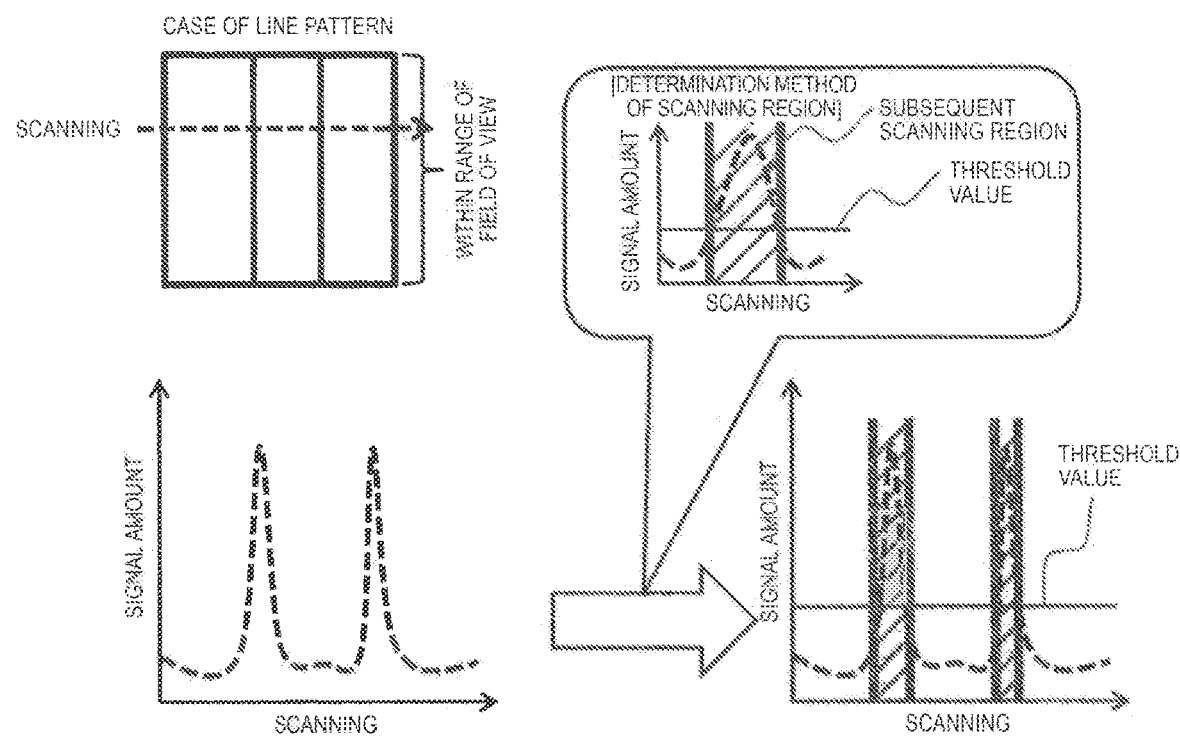

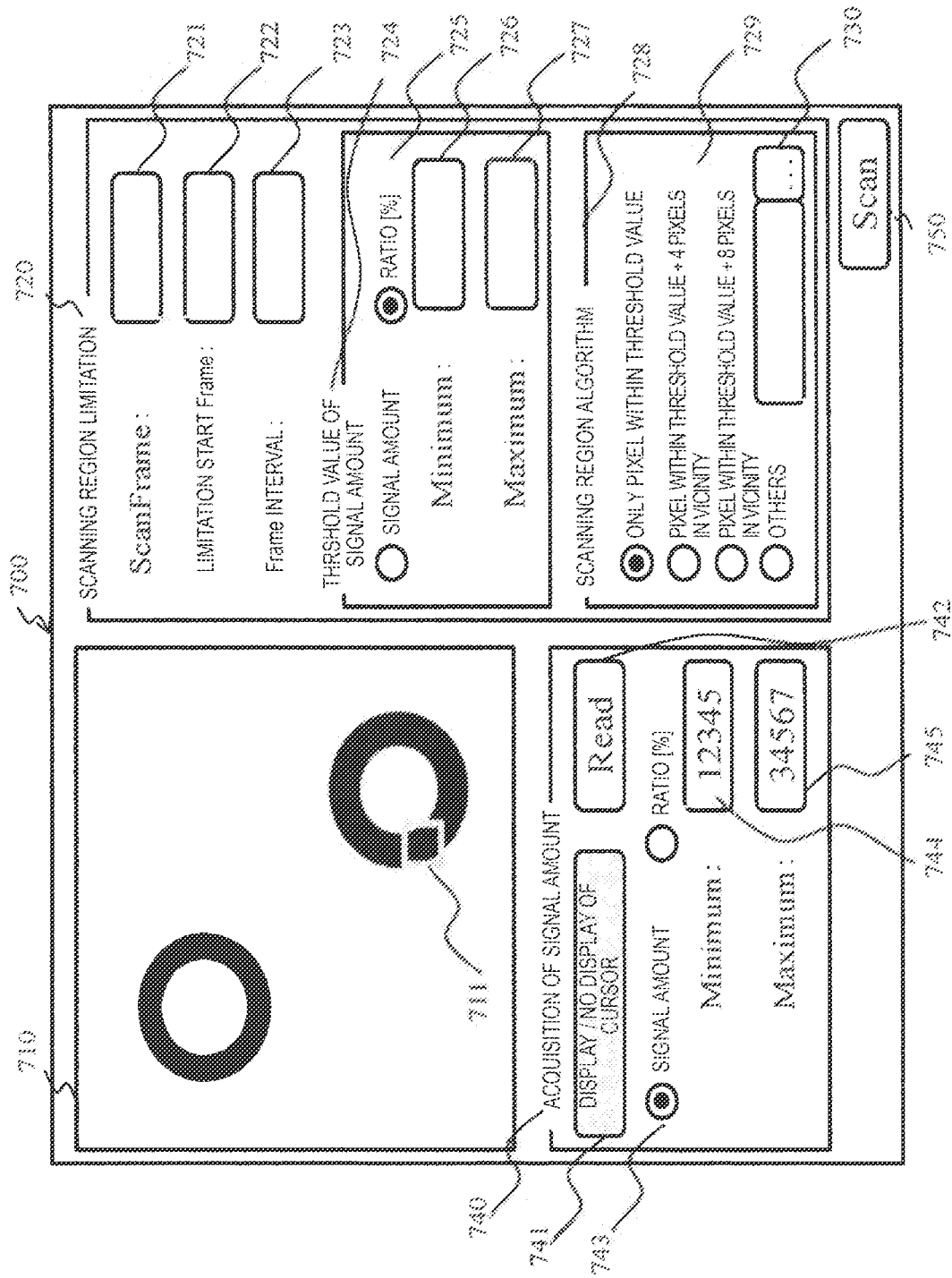
[Fig. 7]

[Fig. 8]
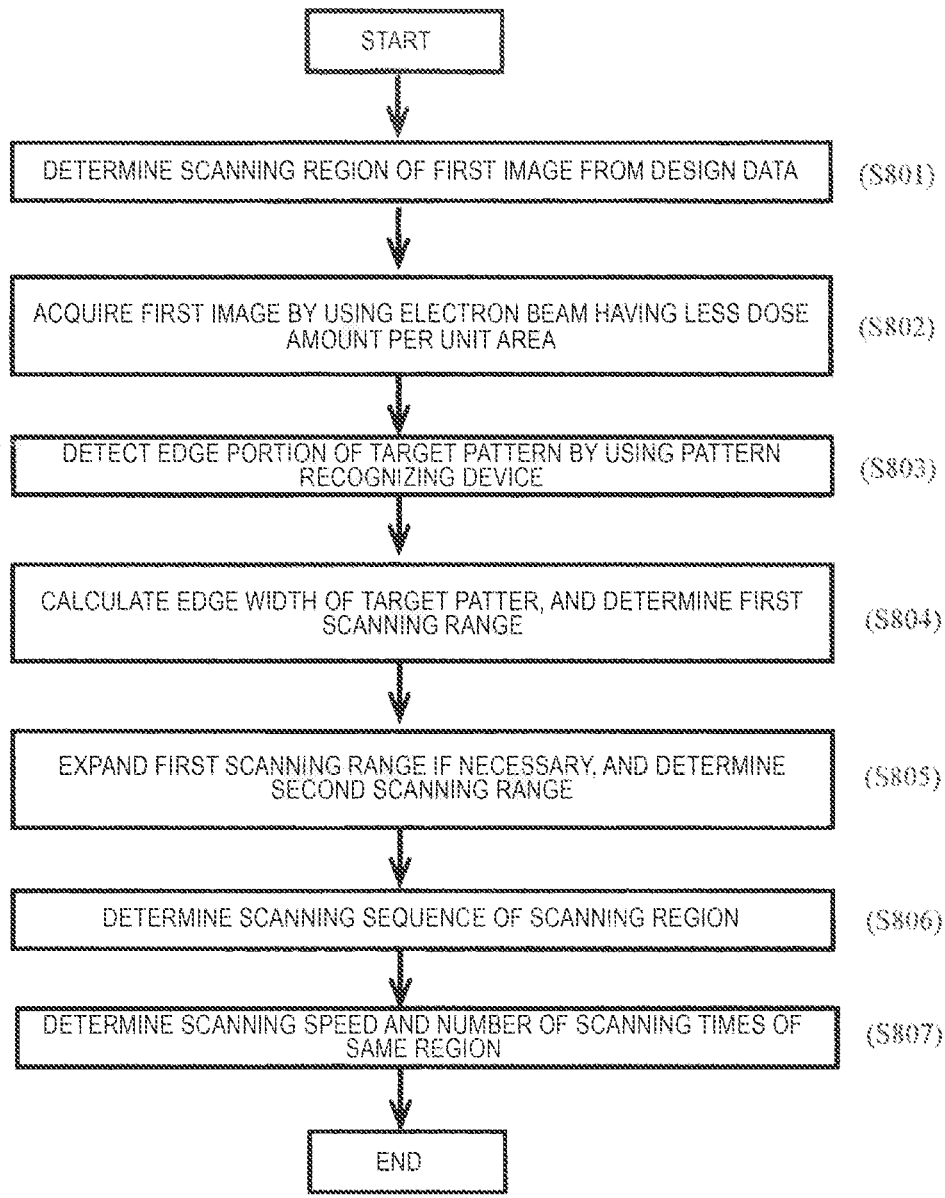

[Fig. 9A]
TARGET PATTERN
X-DIRECTION
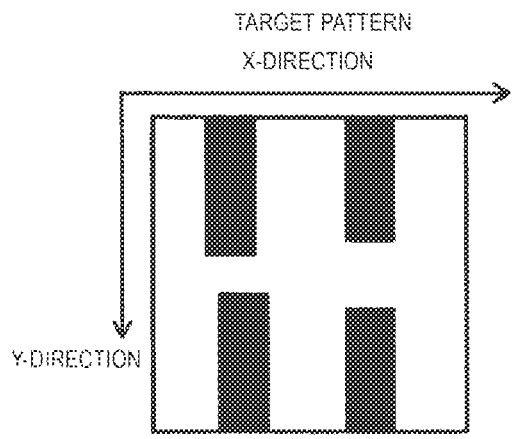
Y-DIRECTION
[Fig. 9B]
PATTERN RECOGNITION
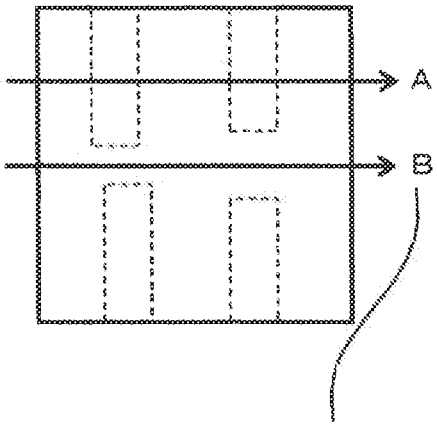
[Fig. 9C] DETECTION OF EDGE PORTION
PATTERN EXTRACTION THRESHOLD VALUE
CONTRAST OF A
CONTRAST OF B
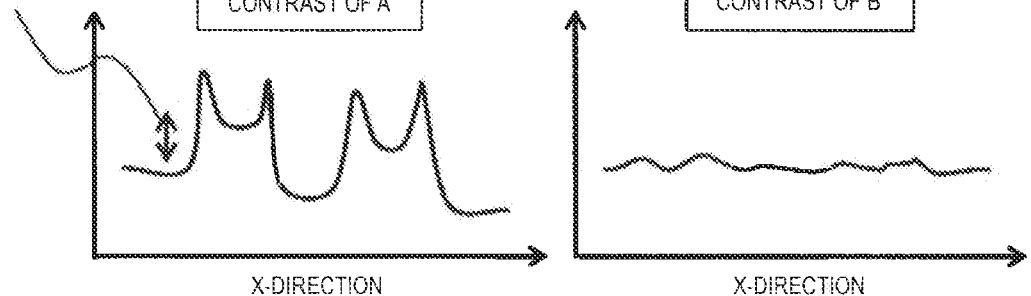
X-DIRECTION
X-DIRECTION
(d) DETERMINATION OF SCANNING REGION
CONTRAST
EDGE PORTION
THRESHOLD VALUE
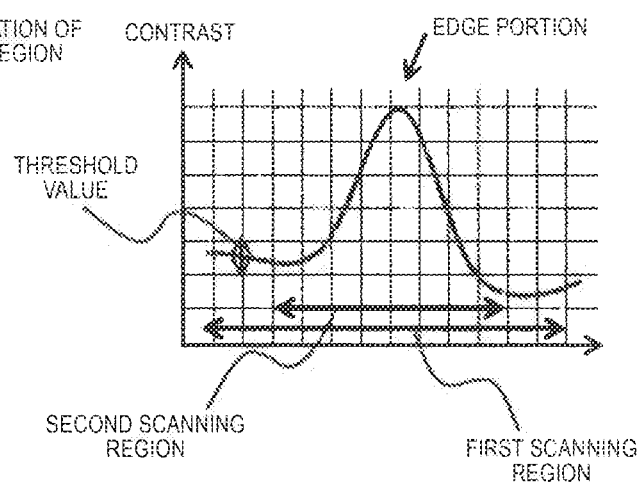
SECOND SCANNING REGION
FIRST SCANNING REGION

[Fig. 10]
MATRIX OF SCANNING SPEED AND NUMBER OF SCANNING TIMES
|  | SPEED b | SPEED c | SPEED d | SPEED e |
|---|---|---|---|---|
| 1ST |  |  |  |  |
| 4TH |  |  |  |  |
| 8TH |  |  |  |  |
| 16TH |  |  |  |  |
[Fig. 11]
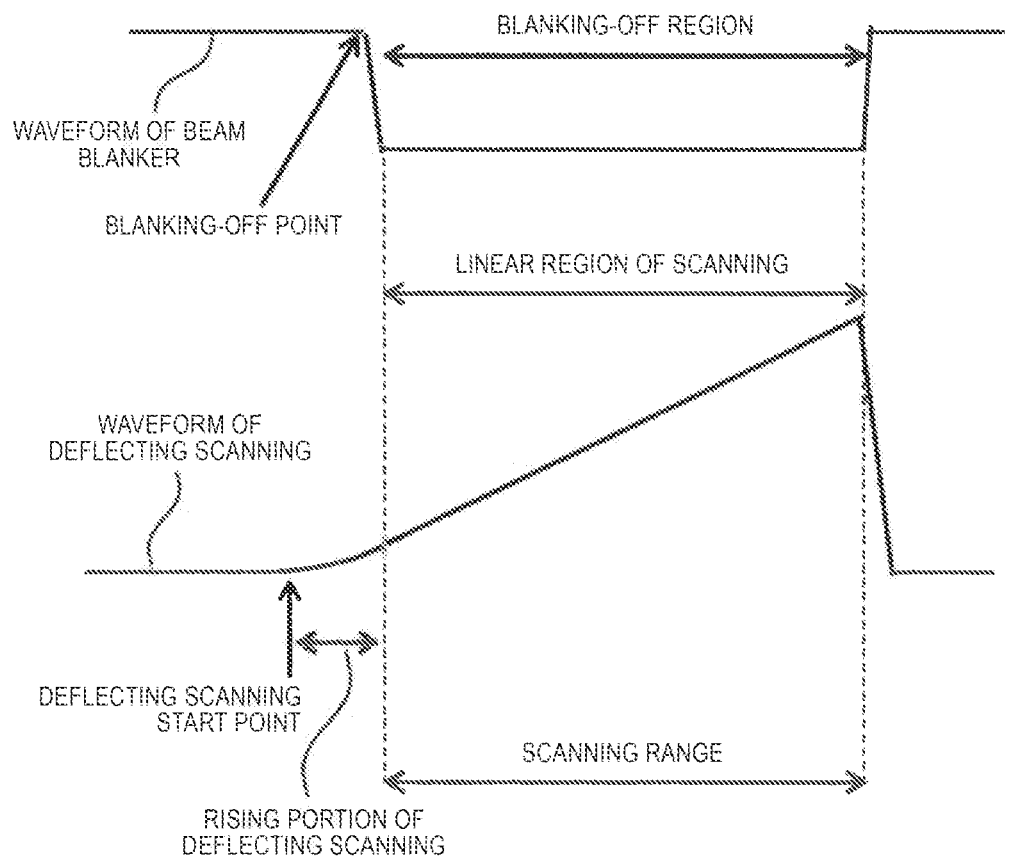

[Fig. 12]
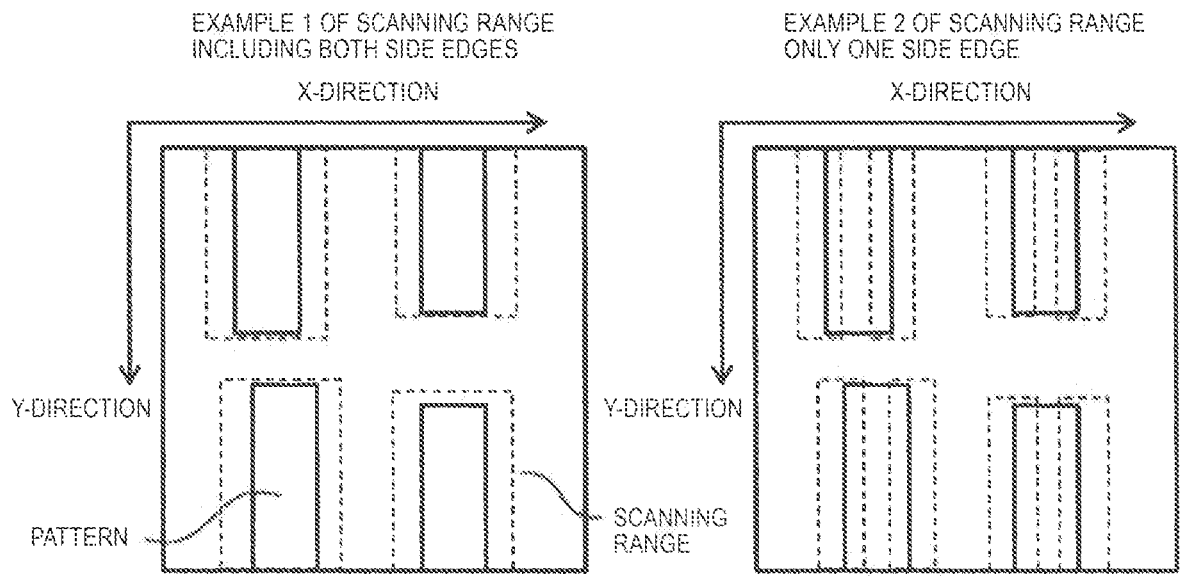
[Fig. 13]
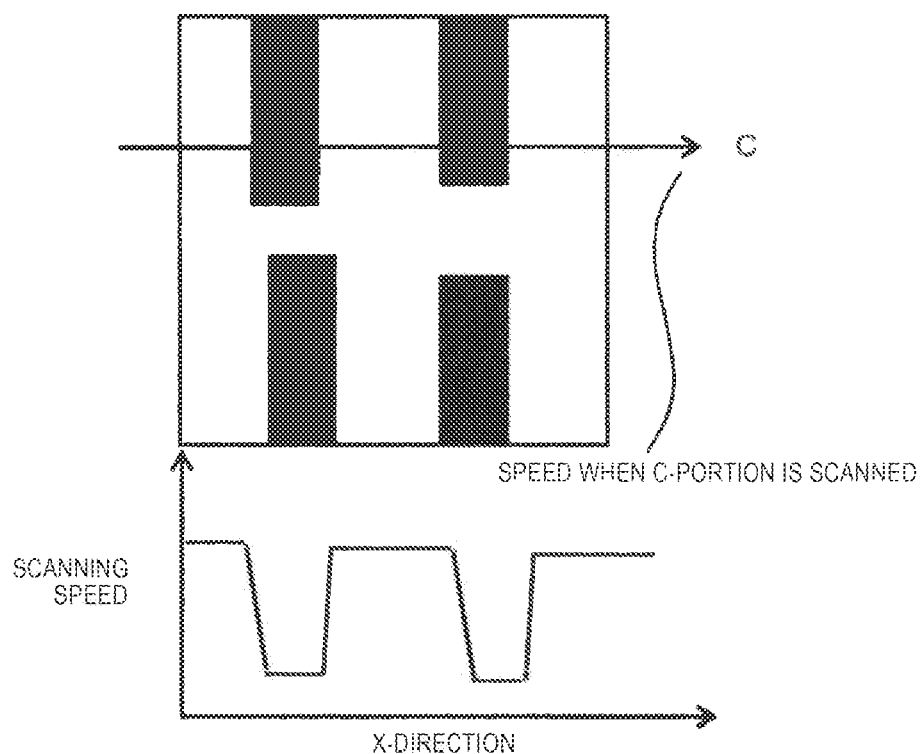

[Fig. 14]
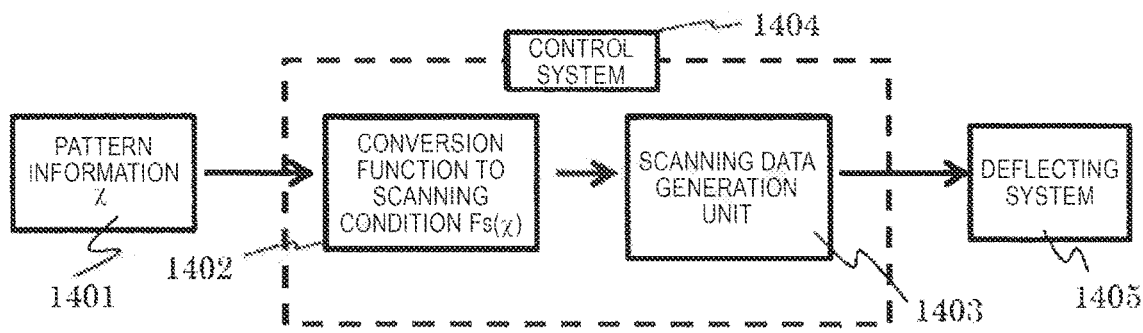
[Fig. 15]
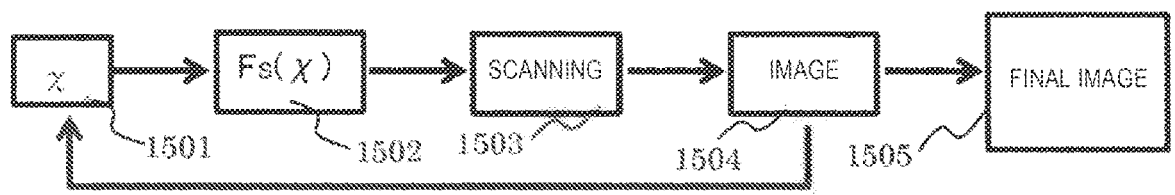
[Fig. 16]
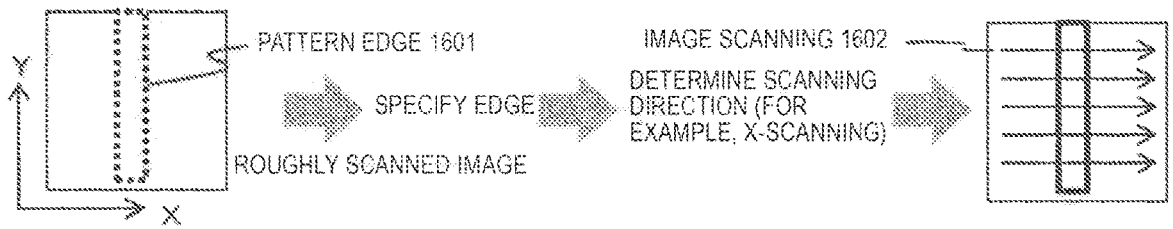
[Fig. 17]
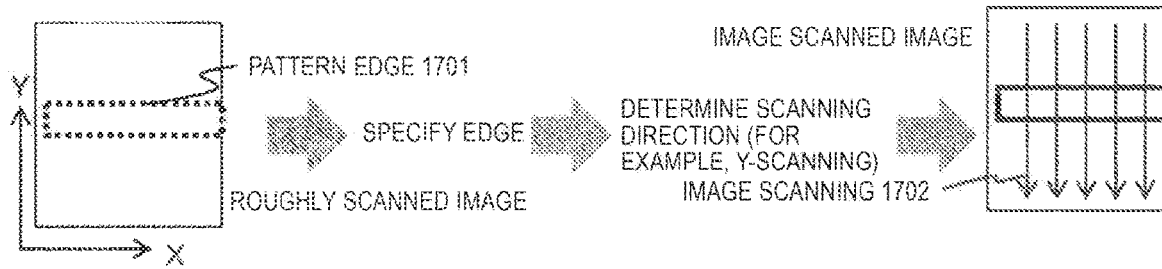

[Fig. 18]
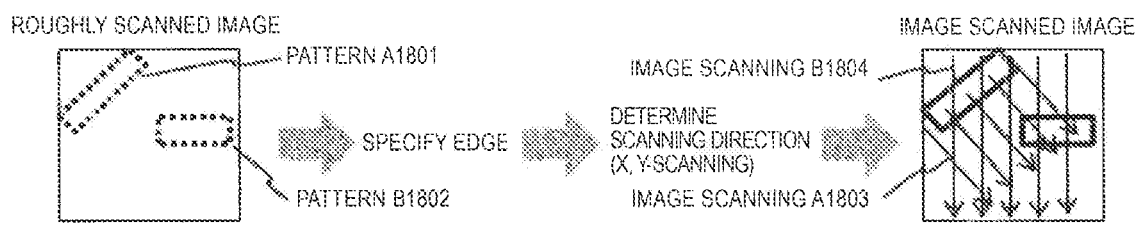
[Fig. 19]
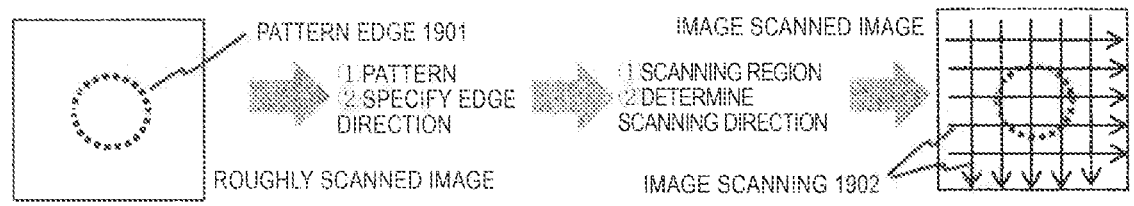
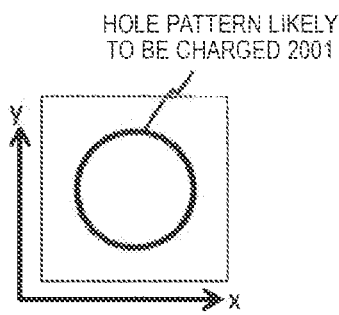
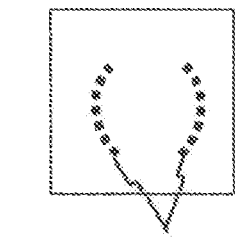
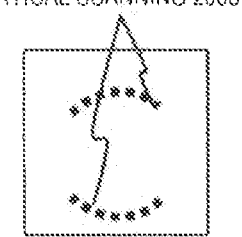
[Fig. 20A]   [Fig. 20B]   [Fig. 20C]

[Fig. 21]
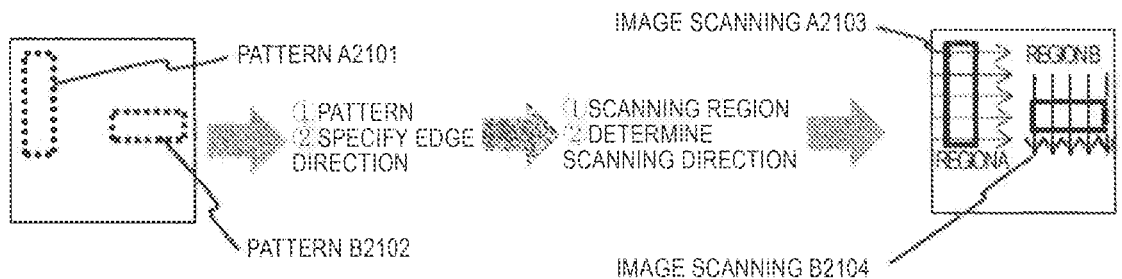
[Fig. 22]
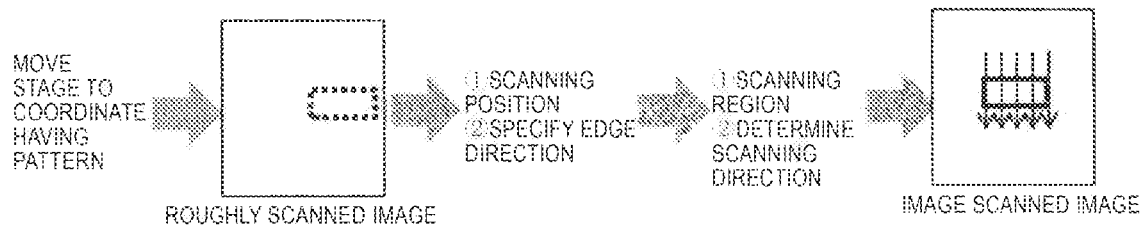
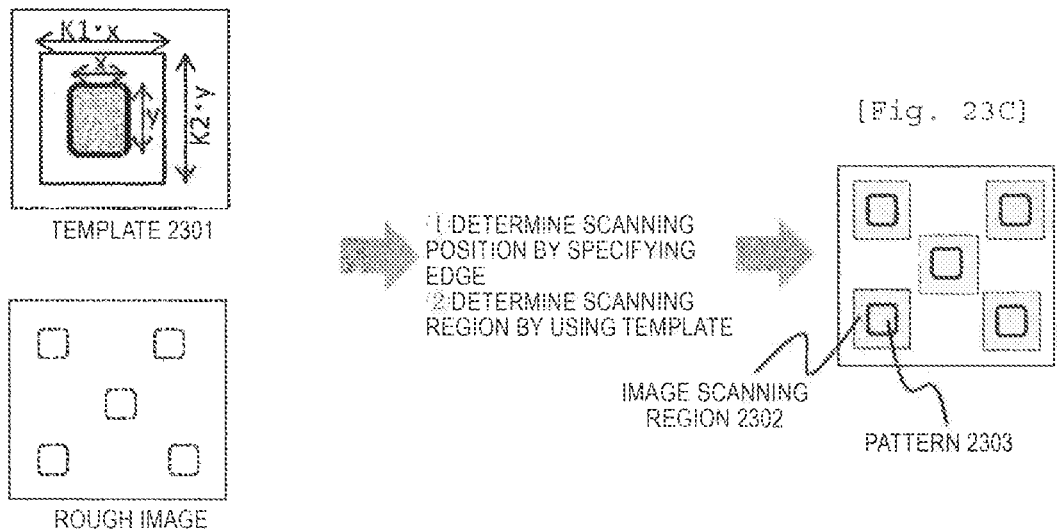
[Fig. 23A]
[Fig. 23C]
[Fig. 23B]

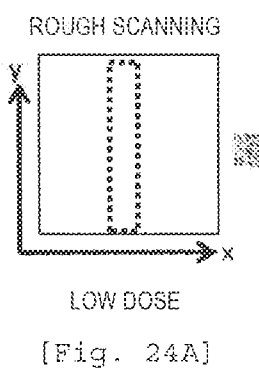
[Fig. 24A]
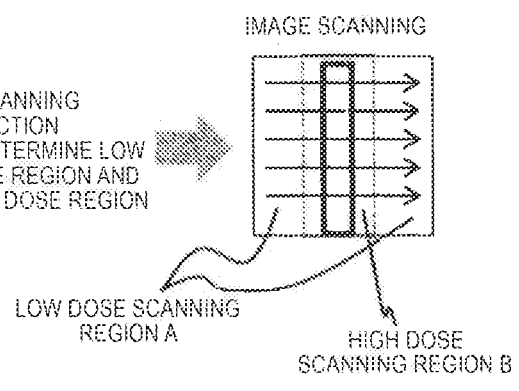
[Fig. 24B]
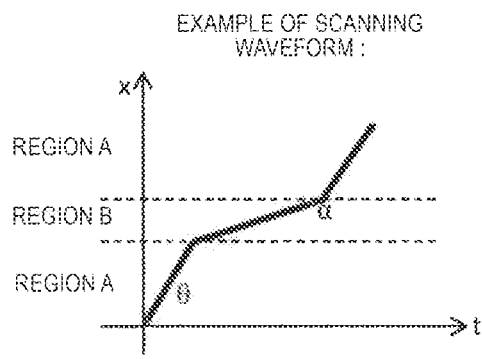
[Fig. 24C]
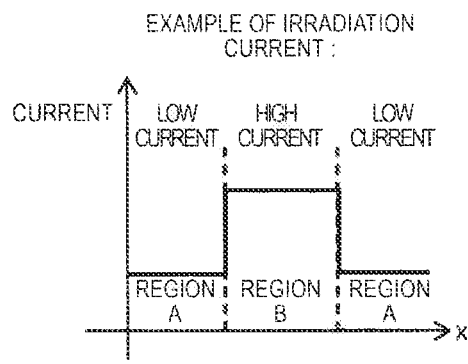
[Fig. 24D]

[Fig. 25A]
NORMAL SCANNING
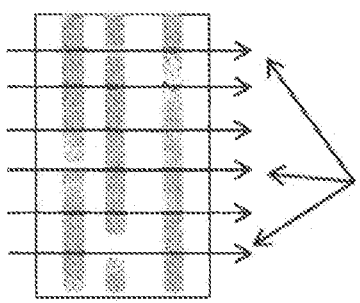
SCAN POSITION HAVING NO LINE
[Fig. 25B]
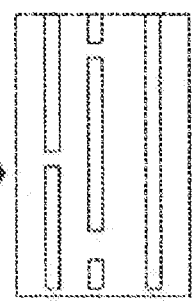
SPECIFY EDGE PORTION BY ROUGH SCANNING
[Fig. 25C]
DO NOT SCAN PORTION HAVING NO LINE
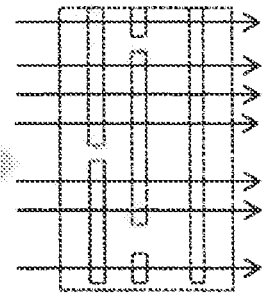
[Fig. 26]
ROUGH SCANNING
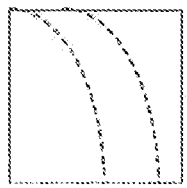
SPECIFY EDGE ➤ DETERMINE SCANNING DIRECTION
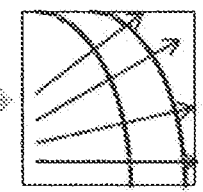
IMAGE SCANNING IS DETERMINED SO AS TO BE PERPENDICULAR TO EDGE

CHARGED PARTICLE BEAM DEVICE HAVING INSPECTION SCAN DIRECTION BASED ON SCAN WITH SMALLER DOSE

CROSS REFERENCE TO RELATED APPLICATION

This application is a divisional of U.S. application Ser. No. 15/329,468, filed Jan. 26, 2017, which is a 371 of international Application No. PCT/JP2015/071186, filed Jul. 27, 2015, which claims priority from Japanese Patent Application Nos. 2014-155678, 2014-155679, and 2014-155680, filed Jul. 31, 2014, the disclosures of which are expressly incorporated by reference herein.

TECHNICAL FIELD

The present invention relates to a charged particle beam device, and particularly relates to a charged particle beam device which can properly set a scanning condition of a beam.

BACKGROUND ART

As a semiconductor pattern has been micronized, a slight shape difference has affected operation characteristics of a device. Accordingly, there is a growing need for shape management. Therefore, a scanning electron microscope (SEM) used in inspecting and measuring semiconductors requires higher sensitivity and higher accuracy than those in the related art. When a sample is irradiated with an electron beam, the SEM observes a shape of a surface by detecting a secondary electron discharged from the sample. In this case, the detected secondary electron has low energy, and is likely to receive charging influence of the sample. Due to a recently micronized pattern or use of a low dielectric constant material such as low-k, the charging influence is noticeable. In some cases, it becomes difficult to capture a signal from a place which requires management. In addition, some patterns shrink due to beam irradiation. Therefore, it is necessary to properly set an irradiation condition.

PTL 1 discloses an electron microscope in which at the time of frame integration, an image is formed by integrating image signals obtained by selective scanning performed on a specific pattern and by scanning performed on a region including the specific pattern and a region other than the specific pattern. In addition, PTL 2 discloses an electron beam device in which an image is formed by performing beam scanning after selectively setting a scanning region in a portion such as a pattern edge. In PTL 3, a method is described in which a shape of a pattern is specified from an electron beam image, and in which a scanning direction of an electron beam is controlled so as to be perpendicular to an edge of the pattern.

CITATION LIST

Patent Literature

PTL 1: JP-A-2010-272398
PTL 2: JP-A-2013-185852
PTL 3: U.S. Pat. No. 6,879,719

SUMMARY OF INVENTION

Technical Problem

As disclosed in PTL 1 or PTL 2, a beam irradiation amount per unit area can be reduced by limiting a scanning region. As a result, it is possible to restrain charging or shrinkage from occurring. However, depending on a pattern workmanship, there is a possibility that a pattern or pattern edge may not be formed at a predetermined position. As a result, there is a possibility that measurement may fail since a position of a scanning region whose range is narrowed is different from a position of a desired measurement target. Both PTL 1 and PTL 2 disclose that the charging or the shrinkage can be restrained by reducing a total beam irradiation amount, but give no consideration to whether there is the possibility that the position of the scanning region and the position of the measurement target may differ from each other. In addition, according to the method disclosed in PTL 3, it is necessary to separately perform beam scanning for specifying the pattern shape and scanning in which the scanning direction of the electron beam is controlled. Consequently, the beam irradiation amount increases.

Hereinafter, a charged particle beam device will be described. A first object thereof is to compatibly restrain a beam irradiation amount and maintain high measurement success rate by accurately aligning a position of a measurement target and a position of a scanning region with each other even in a case where beam scanning is performed while a scanning range is limited.

Hereinafter, a charged particle beam device will be described. A second object thereof is to compatibly set a scanning line direction to a proper direction and restrain a beam irradiation amount.

Solution to Problem

As one aspect of a first configuration for achieving the above-described first object, a charged particle beam device is proposed herein. The charged particle beam device includes a scanning deflector that performs scanning with a charged particle beam discharged from a charged particle source, a detector that detects a charged particle obtained based on the scanning with the charged particle beam, and a control device that controls the scanning deflector, based on selection of a predetermined number of frames n. The control device controls the scanning deflector so that scanning with the charged particle beam is selectively performed on a portion on a sample corresponding to a pixel satisfying a predetermined condition or on a region including the portion on the sample, from an image obtained by scanning with the charged particle beam for the number of frames m (m≥1) which is smaller than the number of frames n.

As one aspect of the first configuration for achieving the above-described first object, a charged particle beam device is proposed herein. The charged particle beam device includes a scanning deflector that performs scanning with a charged particle beam discharged from a charged particle source, a detector that detects a charged particle obtained based on the scanning with the charged particle beam, and a control device that adjusts an irradiation condition of the charged particle beam in at least two ways. The control device measures or inspects a pattern formed on the sample, based on a signal obtained by scanning a first region on the sample with a first charged particle beam. The control device scans a second region including the first region with a second charged particle beam whose dose amount is smaller than that of the first charged particle beam, and specifies the first region, based on a signal obtained by scanning with the second charged particle beam.

As one aspect of a second configuration for achieving the above-described second object, a charged particle beam device is proposed herein. The charged particle beam device includes a scanning deflector that performs scanning with a charged particle beam discharged from a charged particle source, a detector that detects a charged particle obtained based on the scanning with the charged particle beam, and a control device that adjusts an irradiation condition of the charged particle beam in at least two ways. The control device measures or inspects a pattern formed on the sample, based on a signal obtained by scanning a first region on the sample with a first charged particle beam. The control device scans a second region including the first region with a second charged particle beam whose dose amount is smaller than that of the first charged particle beam, and selects a scanning direction of the first charged particle beam, based on a signal obtained by scanning with the second charged particle beam.

Advantageous Effects of Invention

According to the above-described first configuration, it is possible to compatibly restrain a beam irradiation amount and maintain high measurement success rate. In addition, according to the above-described second configuration, it is possible to compatibly set a scanning line direction to a proper direction and restrain a beam irradiation amount.

BRIEF DESCRIPTION OF DRAWINGS

FIG. 1 is a view schematically illustrating a scanning electron microscope.

FIG. 2 is a view schematically illustrating a coordinate memory that stores a beam irradiation condition in pixel unit.

FIG. 3 is a flowchart illustrating an image integration process which follows a limiting process of a scanning region.

FIG. 4 is a flowchart illustrating the limiting process of the scanning region.

FIG. 5 is a view schematically illustrating the limiting process of the scanning region.

FIG. 6 is a view schematically illustrating the limiting process of the scanning region.

FIG. 7 is a view illustrating an example of a graphical user interface (GUI) screen for setting a beam scanning condition.

FIG. 8 is a view illustrating a process of selecting a region for performing a high dose scanning by recognizing a pattern inside a low dose image.

FIGS. 9A-9C are views for describing a method of determining a scanning region.

FIG. 10 is a view illustrating an example of database for recording an image quality evaluation value of each beam scanning condition.

FIG. 11 is a view illustrating an example of a control signal supplied to a scanning deflector and a blanking deflector.

FIG. 12 is a view illustrating an example of selecting a high dose scanning region inside a low dose image.

FIG. 13 is a view illustrating a relationship between a pattern array within a beam scanning range and a scanning speed.

FIG. 14 is a view illustrating a process of determining a beam scanning pattern, based on measurement target pattern information.

FIG. 15 is a view illustrating a process flow in forming an image, based on an input of the measurement target pattern information.

FIG. 16 is a view illustrating a process of determining a scanning direction suitable for a vertical pattern.

FIG. 17 is a view illustrating a process of determining a scanning direction suitable for a horizontal pattern.

FIG. 18 is a view illustrating a process of determining a scanning direction suitable for a two-dimensionally arrayed pattern.

FIG. 19 is a view illustrating a process of determining a scanning direction suitable for a hole shape.

FIGS. 20A-20C are views illustrating a process of determining an edge direction, based on low dose scanning performed using a scanning line in two directions.

FIG. 21 is a view illustrating an example in which one field of view is divided into a plurality of scanning regions.

FIG. 22 is a view illustrating an example of scanning only a location having a pattern.

FIGS. 23A-23C are views illustrating a process of determining a scanning region, based on pattern recognition using a template.

FIGS. 24A-24D are views illustrating an example in which a field of view is internally divided into a low dose region and a high dose region.

FIGS. 25A-25C are views illustrating an example of a scanning pattern in accordance with the presence or absence of a pattern.

FIG. 26 is a view illustrating an example of a scanning pattern in accordance with an edge direction of a pattern.

DESCRIPTION OF EMBODIMENTS

FIG. 1 is a view schematically illustrating a scanning electron microscope (SEM) which is one type of charged particle beam devices. An electron beam 103 which is drawn out from an electron source 101 by a lead electrode 102 and accelerated by an acceleration electrode (not illustrated) is condensed by a condenser lens 104 which is a form of focusing lenses. Thereafter, the electron beam 103 is used in one-dimensionally or two-dimensionally scanning a portion on a sample 109 by a scanning deflector 105. The electron beam 103 is decelerated by a negative voltage applied to an electrode incorporated in a sample stage 108, condensed by a lens operation effect of an objective lens 106 and is used in irradiating the portion on the sample 109.

If the sample 109 is irradiated with the electron beam 103, an electron 110 such as a secondary electron and a backscattered electron is discharged from the irradiated location. The discharged electron 110 is accelerated in an electron source direction by an accelerating operation effect based on a negative voltage applied to the sample, and collides with a conversion electrode 112, thereby generating a secondary electron 111. The secondary electron 111 discharged from the conversion electrode 112 is captured by a detector 113. Depending on the amount of the captured secondary electron, an output of the detector 113 varies. Luminance of a display device (not illustrated) varies in accordance with the output. For example, in a case of forming a two-dimensional image, a deflecting signal to the scanning deflector 105 and the output of the detector 113 are synchronized with each other, thereby forming an image of a scanning region. In addition, the scanning electron microscope illustrated in FIG. 1 includes a deflector (not illustrated) for moving the scanning region of the electron beam. The deflector is used in order to form an image of the same shape pattern present at a different position. The deflector is called an image shift deflector, and can move a position in a field of view of the electron microscope without causing the sample stage to move the sample. The image shift deflector and the scanning deflector may serve as a deflector used in common. In this manner, an image shift signal and a scanning signal may be superimposed on each other so as to be supplied to the deflector.

Referring to an example in FIG. 1, an example has been described in which the electron discharged from the sample is once converted by the conversion electrode and detected. As a matter of course, without being limited to this configuration, for example, a configuration can be adopted in which an electron multiplier tube or a detection surface of the detector is disposed on an orbit of the accelerated electron. In addition, a blanking deflector (not illustrated) is installed inside SEM 100. The blanking deflector is a mechanism that blocks beam irradiation on the sample by deflecting the beam out of a beam optical axis, and is controlled in accordance with an operation parameter stored in a coordinate memory (to be described later).

The present embodiment employs an electrostatic deflector as the scanning deflector 105. Compared to an electromagnetic deflector, high speed scanning can be performed. If the high speed scanning is not required, the electromagnetic deflector may be used.

A control device 120 controls each configuration of the scanning electron microscope, and is provided with a function to form an image, based on the detected electron and a function to measure a pattern width of a pattern formed on a sample, based on intensity distribution of the detected electron which is called a line profile. In addition, the control device 120 internally includes a SEM control device which mainly controls an optical condition of SEM, and a signal processing device which performs signal processing on a detection signal obtained by the detector 113. The SEM control device includes a scanning control device for controlling a beam scanning condition. The scanning control device performs beam scanning, based on information stored in a coordinate memory as illustrated in FIG. 2. Each address of a coordinate memory 200 stores time data, X-coordinate data, Y-coordinate data, an operation parameter, and incorporated enable data. Data input to "time" in the memory represents an irradiation time or an arrival time in each address, and can be set in pixel unit. In addition, a beam operation parameter (blanking on/off and direction) can also be set in pixel unit. The irradiation time (scanning time) and the blanking on/off can be controlled in pixel unit. Each address corresponds to a pixel. The time data in the coordinate memory is read by a timer. The data is read from the coordinate memory in such a way that an address counter counts up one coordinate data as one unit. An update time of the address counter can be changed in coordinate unit. Blanking enable data controls blanking of a primary electron beam in coordinate unit. In addition, the incorporated enable data controls writing on an image memory included in the signal processing device.

For example, the image memory can store 256 gradations in a depth direction with 1,024×1,024 pixels. Based on a signal output from the SEM control device, the signal is written for each address (pixel). An address signal corresponding to a memory position of the image memory is synchronized with a beam irradiation position, thereby aligning the beam irradiation position and the written coordinate with each other. The signal read corresponding to the address is converted into an analog signal from a digital signal by a D/A converter, and is input to an image display device after being subjected to luminance modulation. The control device 120 performs an integration process of integrating image data obtained based on scanning performed a plurality of times. For example, the integration process is performed in such a way that signals obtained by a plurality of frames are additionally averaged for each pixel.

The control device 120 performs the following control, based on information input to the coordinate memory 200.

Embodiment 1

According to the present embodiment, for example, in a charged particle beam device such as the scanning electron microscope, a scanning region of a primary electron beam for obtaining an observation image having a high S/N ratio is limited to only a desired pattern required for measurement or observation within a range of a field of view during a process of acquiring the observation image. In this manner, an irradiation amount of the primary electron beam is restrained in a region other than the desired pattern within the range of the field of view, and shrinkage of the pattern is restrained.

Therefore, when the observation image is acquired, a scanning region is limited by extracting a region having the same signal amount as that of the desired pattern from the inside of the image acquired during the acquiring process and by setting the region or only the vicinity of the region to a subsequent scanning target region. While this process is repeatedly performed, the observation image of the desired pattern is acquired.

According to the above-described configuration, when the observation image is acquired, the scanning region is limited by extracting the region having the same signal amount as that of the desired pattern from the inside of the image acquired during the acquiring process and by setting the region or only the vicinity of the region to the subsequent scanning target region. This process is repeatedly performed until the observation image is completely acquired. In this manner, the observation image of the desired pattern within the range of the field of view which has the high S/N ratio can be acquired while the irradiation amount of the primary electron beam is continuously restrained.

FIG. 3 is a flowchart illustrating a process of forming an integrated image. For example, the process (to be described later) is performed in accordance with an operation recipe stored in a storage medium incorporated into the control device 120.

First, the sample 109 is transported onto the sample stage 108 (Step 302). Since a high vacuum state is maintained in a sample chamber 107, an atmosphere where the sample is present is brought into a vacuum state by a preliminary evacuation chamber (not illustrated). Thereafter, the sample is introduced into the sample chamber. Next, the sample stage 108 is driven so that a beam irradiation position of the sample 109 is irradiated with the electron beam 103 discharged from the electron source 101 (Step 303). Next, based on a device condition stored in the operation recipe, conditions such as the number of frames n which shows the total number of sheets to be integrated or a method of limiting the scanning region are set.

The control device 120 controls the scanning deflector 105 so as to perform beam scanning based on the set device condition and causes a frame memory to write a signal based on the detection signal obtained by scanning, based on the enable data stored in the coordinate memory illustrated in FIG. 2 (Step 304 and Step 305). For example, in this stage, the enable data of all addresses is set to allow writing on the memory. An analysis (to be described later) is performed on an image formed based on the data written in this way.

In Step 307, the scanning region is limited by using information accumulated up to m (1≤m<n) frames. Here, the number of frames n is set so as to sufficiently obtain SN required for desired measurement, and is set as a setting item of the operation recipe of the scanning electron microscope. Based on the set condition, the control device 120 performs beam scanning for the number of frames. Details of this process will be described later. In Steps 308 and 309, in a state where the scanning region is limited, the beam scanning is performed. Beam scanning of a selected region and data writing on a selected address are performed, thereby forming an image. This process is performed at a fixed frame interval $\Delta f$ ($1 \leq \Delta f < n$). This frame interval can be designated by an operator.

Image data formed as described above is stored in a predetermined storage medium, and is used in measuring or inspecting a pattern. After the image data is acquired, the sample is transported from the sample chamber 107, and the sample is measured, thereby completely inspecting the sample (Step 310).

FIG. 4 is a flowchart illustrating a specific process in a scanning region limiting process performed in Step 307 in FIG. 3. First, the image data obtained by scanning for a predetermined number of frames (m) is acquired (Step 402). Next, signal data of each pixel is acquired so as to determine whether or not a signal amount satisfies a predetermined condition (Steps 403 to 405). In a case of this example, it is determined whether or not the signal amount is a predetermined value or greater. For example, signal amount information of a pixel (X, Y) is extracted from signal amount information accumulated up to the m-frame. In a case where the signal amount of the pixel (X, Y) exceeds a threshold value st of the designated signal amount, the pixel is set as a subsequent frame scanning location. More specifically, in a case where the signal amount of the pixel (X, Y) exceeds the threshold value st, the time, the operation parameter, and the enable are set for a corresponding address of the coordinate memory illustrated in FIG. 2. The pixel (X, Y) is used in acquiring a signal by means of beam irradiation. Accordingly, the coordinate memory is set so as to ensure a proper irradiation time and blanking-off, and to perform a writing process.

On the other hand, a pixel which does not satisfy the predetermined condition is not irradiated with the beam. Accordingly, the coordinate memory is updated so as to ensure blanking-on, and so as not to perform the writing process.

For example, the threshold value st of the signal amount can be designated by using a method of setting a value of the signal amount, for example, a luminance value or a percentage such as any percentage from the largest signal amount in the entire image. This value can be designated by using a method of automatically calculating a value from a template image of a desired pattern, or can be designated by a user setting the threshold value to a numerical value.

Through the above-described process, the pixel (X, Y) is set to a scanning target subsequent the next frame. As illustrated in FIG. 3, when the observation image is acquired, Steps 306 and 307 are repeatedly performed for each frame. In this manner, while the inner region in the field of view is scanned, a portion whose signal amount increases due to noise is excluded from the scanning region. Accordingly, it is possible to acquire an image whose S/N ratio is high.

In addition, the number of integrated frames is determined depending on image quality required by an operator of the electron microscope. As the number of frames increases, the signal amount increases. On the other hand, excessive beam irradiation induces charging of the sample. Accordingly, it is necessary to set the proper number of frames so as to satisfy accuracy required for measurement and so as not to perform unnecessary beam irradiation. According to the present embodiment, a portion having much signal amount can be scanned for a predetermined number of frames. Therefore, the signal amount of a portion serving as a measurement reference during dimension measurement of a pattern, such as an edge portion, can satisfy requested specifications. It is possible to restrain only the irradiation amount of a portion other than the edge which is not directly required for the measurement. Therefore, it is possible to compatibly perform very accurate measurement in compliance with the requested specifications and restrain charging or shrinkage from occurring due to beam scanning.

FIG. 7 illustrates an embodiment of GUI used when an operator sets scanning limitation within a range of a field of view. A GUI 700 is installed in the image processing device inside the control device 120. In accordance with an actuating command, OSD is displayed on a display device (not illustrated). The GUI 700 in this embodiment is configured to include an image display region 710, a scanning region limiting unit 720, a signal amount acquisition unit 740, and a scanning button 750.

The image display region 710 displays a template image of a desired pattern which is acquired in advance, and an image acquired when scanning is performed within the range of the field of view. An operator can resize and move a signal amount acquisition cursor 711 displayed inside the image display region 710 by using an input device of the image processing device.

The scanning region limiting unit 720 has a function to input a setting value when scanning which limits the scanning region is performed. A scanning frame setting text box 721 can set the number of frames n for performing the scanning. A limitation start frame setting text box 722 can set the number of frames m for starting to limit the scanning region. A frame interval setting text box 723 can set the number of interval frames $\Delta f$ for performing the process in Steps 306 and 307 in FIG. 3. A threshold value setting area 724 of the signal amount can set the threshold value st of the signal amount. A signal amount setting switch radio button 725 can select whether to set the threshold value st of the signal amount by using the signal amount or whether to set the threshold value st of the signal amount by using a percentage such as any percentage from the largest signal amount of the entire image displayed in the image display region 710. In addition, an algorithm setting unit 728 for determining the scanning region can set how to determine the scanning region subsequent to the next frame.

A signal amount acquisition amount setting unit 740 has a function to display the signal amount by acquiring the signal amount of the designated region from the image displayed in the image display region 710. A cursor display/no display button 741 can control a signal amount acquisition cursor 711 to show display/no display in the image display region 710. A signal amount display form switch radio button 743 can select whether to display a display form of the acquired signal amount information by using the signal amount or whether to display a display form of the acquired signal amount information by using a percentage such as any percentage from the largest signal amount of the entire image displayed in the image display region 710. A signal amount reading button 742 can read the signal amount of the region surrounded by the signal amount acquisition cursor 711 in the image display region 710. The read signal amount matches the content selected by the signal amount display form switch radio button 743. The minimum value is displayed in a minimum signal amount text box 744, and the maximum value is displayed in a maximum signal amount text box 745.

The scanning button 750 can perform scanning within the region of the field of view, based on the content set by the scanning region limiting unit 720.

Embodiment 2

In this embodiment, with regard to the process in Step S406 in FIG. 4 according to Embodiment 1, even in a case where a drift occurs between the m-frame and the m+Δf-frame, the observation target is set to the scanning target subsequent to the next frame. In a case where the observation target is set to only the scanning region subsequent to the m-frame of the pixel (X, Y), the drift occurs due to some reasons between them-frame and the m+Δf-frame. In a case where a position of the observation target is offset, when the m+Δf-frame is scanned, there is a possibility that a pattern may be out of the scanning region. In contrast, as illustrated in FIG. 5, it is possible to correspond to the pixel designated as the scanning target in Step 406 by setting the pixel (X, Y) and 8 pixels in the vicinity {(X−1, Y−1) (X−1, Y) (X−1, Y+1) (X, Y−1) (X, Y−1) (X−1, Y−1) (X+1, Y) (X+1, Y−1)} to the scanning target. In addition, as a scanning target pixel, the pixel (X, Y) and 4 pixels in the vicinity {(X−1, Y) (X, Y−1) (X, Y+1) (X+1, Y)} may be used, but a configuration is not limited thereto.

The GUI in FIG. 7 includes a scanning region algorithm radio button 729 as an item for setting an algorithm for determining this scanning region. The scanning region can be selected from only the pixel within the threshold value, the pixel+4 pixels in the vicinity within the threshold value, and the pixel+8 pixels in the vicinity within the threshold value, and others.

In addition, in a case of shortening a time for the limiting process of the scanning region, as illustrated in FIG. 6, a method may also be used in which the vicinity in only the scanning direction is acquired and only the pixels in the front and rear which exceed the threshold value st of the signal amount are set to the scanning region. In addition, in FIG. 6, it is also possible to correspond to the drift by including one pixel in the front and rear. This method is particularly effective in a case of a pattern orthogonal to the scanning direction. In the GUI in FIG. 7, in a case where "others" are selected as a selection item of the scanning region algorithm radio button 729, a method of determining the scanning region can be employed by using any optional algorithm or reference prepared by a user. When the optional algorithm is read, the optional algorithm is read by utilizing an algorithm reading button 730.

Embodiment 3

With regard to the process in Step 405 in FIG. 4 according to Embodiments 1 and 2, this embodiment solves a problem that an observation target pattern does not necessarily have much signal amount. Instead of the threshold value st, the signal amount for determining the scanning region has a range (srmin, srmax) of the signal amount. In the process in Step 405, it is determined whether the pattern falls within the range (srmin, srmax) of the signal amount designated in advance, and the process in Step 406 is performed in only a case within the range. For example, in a case where the generated image is subjected to image processing such as brightness and contrast adjustment in a post process, the adjustment does not match a portion having much signal amount. Accordingly, this method is effectively used. In the GUI in FIG. 7, in a case where the range of the signal amount is set in the threshold value setting area 724 of the signal amount, the minimum value can be set in a threshold value minimum setting text box 726 of the signal amount, and the maximum value can be set in a threshold value maximum setting text box 727 of the signal amount.

Embodiment 4

In this embodiment, information of the scanning region of the n-$^{th}$ frame is utilized as outline information or information for outputting the outline information. The scanning region of the n$^{th}$-frame is set to only a region which is close to a pre-designated threshold value. For example, in a case where the pre-designated threshold value shows a value having much signal amount, the scanning region is close to the outline information of a desired pattern. This information is output together with the acquisition of the observation image in Step 309 in FIG. 3.

Hitherto, in the above-described embodiments, examples of the scanning electron microscope relating to the charged particle beam device and employed in measuring a sample or in observing a structure have been described in detail. However, the present invention is not limited to the above-described embodiments. As a matter of course, the present invention can be modified in various ways within the scope not departing from the gist.

Embodiment 5

Embodiments described hereinafter relate to a charged particle beam device, and particularly relate to a charged particle beam device which determines a scanning parameter of a high dose beam used in irradiating a sample, based on sample information obtained by low dose beam scanning.

In order to manage a dimension of a semiconductor device, a critical-dimension scanning electron microscope (CD-SEM) which is one of the scanning electron microscopes and which has high space resolution is widely used. A measurement or inspection target pattern has been more progressively micronized. On the other hand, the number of measurement or inspection targets per one sheet of wafer increases. Therefore, improved throughput of CD-SEM is required. In a case of measuring or inspecting a pattern by using CD-SEM, a peripheral region including the target pattern is scanned in XY-direction (for example, from left to right in an X-direction, and from above to below in a Y-direction), thereby acquiring a SEM image.

However, according to this scanning method, an unnecessary region other than the target pattern is scanned. That is, in order to further improve the throughput or in order to restrain charging of the wafer or shrinkage of the pattern, it is conceivable that a necessary location is selectively scanned without scanning the unnecessary region. However, in some cases, due to sample charging or pattern deformation, an accurate beam scanning position cannot be set at a location which has to be selectively scanned.

High speed scanning is an effective way to restrain sample charging. However, if emission intensity or time of a scintillator is not sufficient, a detection signal is insufficient. In addition, in a case where a drift occurs due to charging, it is conceivable to correct a shifted portion of the scanning region by recognizing a pattern from the obtained image and extracting an edge. However, if hundreds of sheets overlap each other, an enormous calculation system is required.

In the present embodiment, in view of a charging phenomenon occurring during the above-described electron beam irradiation or a deformation possibility of a pattern formed on a sample, a charged particle beam device will be described which sets a beam scanning region at a proper position while a beam irradiation amount is restrained. In particular, a charged particle beam device will be described which sets a scanning region and a scanning speed in accordance with a sample state.

Hereinafter, a scanning electron microscope will be described which can determine a scanning parameter such as the scanning region and the scanning speed, based on a viewpoint of improved throughput, damage to a sample, and sample charging.

In the present embodiment, a scanning electron microscope will be mainly described which includes an electrostatic scanning deflector suitable for high speed scanning and which can control the scanning speed so as to be variable. In order to determine a measurement or inspection target location, high speed scanning is first performed. That is, a first image is acquired by performing scanning with a decreased dose amount per unit area. Subsequently, a measurement or inspection target pattern is recognized from the first image, thereby automatically determining the scanning parameter such as the scanning region and speed. Thereafter, scanning is performed at a lower speed than the speed used when the first image is acquired. That is, the determined scanning region is scanned with an increased dose amount per unit area, thereby measuring or inspecting the target pattern.

More specifically, the following charged particle beam device will be described. A first region is specified, based on a signal obtained by scanning a second region which is a wider region than a region (first region) scanned with a beam for measurement or inspection, with a second beam whose dose amount is less than that of a first charged particle beam for scanning the first region. Based on the specified first region, scanning with the first charged particle beam is performed.

According to the above-described configuration, it is possible to realize measurement or inspection by which the throughput is improved, damage to the sample is reduced, and the sample charging is optimized.

Hereinafter, referring to a flowchart in FIG. 8, a process of determining the scanning region and the scanning speed which are suitable for an inspection or measurement target pattern will be described. In the process, the scanning electron microscope as illustrated in FIG. 1 is used, and one pattern is used from patterns formed on the inside of a wafer surface with the same layout.

First, the scanning region of a first image is determined using design data of a semiconductor device (Step 801). The scanning region of the first image is set so as to include a measurement target pattern. The control device 120 is configured to be accessible to the design data stored in an external storage medium. The control device 120 converts the design data into pattern layout data, and drives the sample stage 108 so that a coordinate position of the wafer which corresponds to the set scanning region is irradiated with a beam of the scanning electron microscope.

The control device 120 performs beam scanning for acquiring the first image after the scanning region of the electron beam is located at a wafer position for acquiring the first image (Step 802). In this case, compared to the scanning speed of the beam scanning for measurement or inspection (to be described later), the scanning range determined in Step 801 is scanned at a higher speed (speed a). In this way, the entire surface is scanned with a decreased dose amount per unit area, thereby acquiring the first image including pattern information of the measurement or inspection target. In addition to the scanning at the higher scanning speed, it is conceivable to limit a dose amount by preparing apertures having openings with a plurality of sizes which limit beam passage and decreasing the size of the opening. However, a beam irradiation condition has to be changed. Accordingly, in order to enable high speed measurement or inspection, it is desirable to perform dose control using the higher scanning speed without changing the irradiation condition of the beam itself.

In Step 803, a process of recognizing a pattern present inside the first image is performed. For example, as illustrated in FIG. 9, in this process, a profile waveform is extracted from the first image so as to recognize a position (edge portion) whose luminance value is a predetermined threshold value or greater or a position of a region interposed between the positions whose luminance value is the predetermined threshold value or greater (pattern region interposed between edges). Specifically, a contrast value (luminance value) in the X-direction (pixel X) is calculated for each Y-line. For example, the profile waveform such as A and B as illustrated in FIG. 9(c) is acquired, and a pixel position at which the contrast value in the X-direction is maximized is determined as the edge portion. A threshold value is provided for the contrast value, and a position having a value equal to or greater than the threshold value is recognized as a pattern position. The reason is as follows. As illustrated by the contrast of B in FIG. 9(c), a slight difference in the contrast value occurs in a place having no pattern due to random noise. Accordingly, in this manner, the maximum value is not erroneously detected as the edge.

In Step S804, an edge width of the pattern is obtained. With regard to the contrast value obtained in Step 803 as illustrated in FIG. 9(d), a contrast difference in pixels X adjacent in the leftward direction from the maximum value is calculated. A pixel position where the changed amount is a preset threshold value or smaller is determined as a background portion other than the pattern. Similarly, a pixel position of the background portion is also calculated in the rightward direction from the maximum value, thereby determining the edge width. In this manner, a first scanning region is determined.

In Step 805, with regard to the first scanning region obtained in S4 as illustrated in FIG. 9(d), a second scanning region is set so that the edge is reliably included in the scanning region. The edge position obtained in Step 803 is a position determined from an image acquired using the low dose electron beam. Accordingly, there is a possibility that a detailed position of the edge portion may be different from a real position. Therefore, in order to avoid a case where edge information cannot be sufficiently obtained, a constant value is added to the front and the rear in the scanning region, if necessary. In this manner, the scanning region may be expanded so as to serve as a second scanning range.

In Step 806, a scanning sequence is determined so that the position in the scanning region obtained in Step 804 and Step 805 can be scanned within the shortest time. If a beam moving distance is most shortened, the scanning sequence is determined so that an added value of the distance between a plurality of scanning regions decreases to the minimum. On the other hand, for example, if it is considered that the beam is affected by the charging of the sample due to the scanning region irradiated with the beam, the first scanning region may be scanned, and then, a third scanning region separated from the first scanning region may be scanned.

Thereafter, it is preferable to scan a second scanning region closer to the first scanning region than the third scanning region. According to this scanning sequence, while the third scanning region is scanned, the charging of the first scanning region is eased to some extent. Accordingly, when the second scanning region is scanned, it is possible to restrain the beam from being affected by the charging of the first scanning region.

In Step 807, the scanning speed and the number of scanning times at the same location, that is, the number of image superimposition times is determined. A second image used for measurement or inspection is acquired using a higher dose than that used in acquiring the first image. Accordingly, scanning is performed at a slower speed than the first scanning speed (speed a). In this case, it is necessary to set an optimal scanning speed in accordance with a sample state. The scanning speed is obtained as follows. The second image is acquired, and S/N is evaluated using a matrix as illustrated in FIG. 10, which shows different speeds in several stages (for example, speeds b, c, d, and e, however, a>b>c>d>e) and the number of scanning times in several stages (for example, once, four times, and eight times).

A condition for obtaining the fastest throughput is determined as a scanning parameter from the scanning speed and the number of scanning times which are equal to or greater than the preset S/N. In addition, in a case where a plurality of target patterns are present in the first image as illustrated in FIG. 9, and in a case where each target pattern has a different scanning parameter which is equal to or greater than the preset S/N, the scanning parameter is set for each target pattern.

According to the above-described determining method, it is possible to set a measurement condition which compatibly enables high speed measurement and very accurate measurement. In order to automatically determine a device condition of the above-described scanning electron microscope, a storage medium of the control device 120 may store an operation program. For example, for the operation program, patterns disposed at different positions are scanned with beams having different combinations of the number of scanning times and the scanning speed. An image quality evaluation value such as S/N or sharpness is obtained. A combination of the number of scanning times and the scanning speed in which the image quality evaluation value satisfies a predetermined condition (for example, a combination whose image quality evaluation value is greatest) is set as the device condition.

In addition, in view of a time so that the electrostatic deflector rises so as to be linearly deflected as illustrated in FIG. 11, in accordance with the scanning speed, a start position of deflection scanning is set to be in front of a position obtained in Step 804 or Step 805. In addition, in a case where it is necessary to move the scanning region, a beam blanker performs blanking. In this case, in view of response delay in blanking, blanking timing is determined so that scanning can be performed from the scanning range in Step 804 or Step 805.

In the example 1 in FIG. 12, the region including both side edges of the target pattern is set as the scanning range. However, in a case where the pattern width is wide as illustrated in the example 2 in FIG. 12 and scanning can be sufficiently performed in the linear region even if the rise of the deflector is considered, the scanning range is determined so that scanning can be performed by scanning one side edge and then moving to the opposite side edge in a state where blanking is performed.

In the above-described manner, the scanning range, the scanning speed, the scanning sequence, and the scanning parameter are determined. If the SEM image having the same pattern on the wafer surface is acquired by causing the scanning control device to control the determined scanning parameter, the throughput can be maintained, and measurement or inspection can be performed so as to provide high S/N.

Embodiment 6

In a case where it is also necessary to obtain information around the measurement or inspection target pattern, the scanning range obtained in S4 or S5 is scanned under the scanning condition obtained in S7. Others are scanned at the speed a used when the first image is obtained or at a speed between the speed a and the speed obtained in S7, thereby obtaining the SEM image. In this case, as illustrated in FIG. 12, the scanning speed a cannot be instantaneously changed to the speed obtained in S7 from the viewpoint of responsiveness. Accordingly, the scanning speed is changed stepwise. This speed change amount is determined by using values obtained before and after the speed is changed.

Embodiment 7

An embodiment described hereinafter relates to an electron microscope, an electron beam irradiation method, and a computer program for the same, and particularly relates to a beam irradiation method, an electron microscope, and a computer program in which pattern detection scanning (hereinafter, referred to as rough scanning) is performed so as to perform image scanning based on a result of the pattern detection scanning.

As semiconductor devices are diversified, there is a growing need to observe or measure a two-dimensional or three-dimensional pattern. In the devices, in many cases, a pattern edge within an observation field of view has multiple directions. Beam scanning employs a method of scanning a sample with an electron beam in one direction and moving the sample in the vertical direction, and a method of moving the electron beam. According to this method, particularly in a case of a charged sample, all pattern edges arrayed two-dimensionally in various directions are less likely to be imaged with the same degree of accuracy.

Therefore, the present embodiment proposes a method of capturing an image by determining optimal scanning based on pattern array information, and a charged particle beam device which realizes the method. In some cases, a pattern formed on a sample may be damaged or shrunk due to electron beam irradiation. In order to reduce damage, it is conceivable to reduce an irradiation current and the number of integrated frames. However, in this case, an image S/N is degraded, and measurement accuracy is degraded. In addition, if beam irradiation energy decreases, damage is reduced. However, resolution becomes poor, thereby causing a problem of degraded measurement accuracy. Therefore, the present embodiment proposes a method of reducing a total irradiation dose applied to the sample and reducing damage by selectively performing beam irradiation on only a portion having a measurement target pattern.

There is a scanning method of scanning a square or rectangular region at a uniform speed by using a fixed triangular waveform signal in order to deflect an electron beam. In contrast, the present embodiment proposes a method of performing beam irradiation by preparing a scanning waveform based on information of an observation or measurement target pattern without using a fixed scanning waveform. Hereinafter, the information for defining the scanning is referred to as scanning data. In the present embodiment, the scanning data becomes a function of the detection target pattern, and can be defined as scanning data Fs=Fs (detection pattern). An image forming flow based actual scanning from the recognition of the measurement target pattern shows pattern information acquisition→preparation of scanning data Fs→scanning and image acquisition.

According to the above-described scanning method, charging influence can be reduced, and observation or measurement accuracy can be improved. In addition, in a case of a device greatly damaged by beam irradiation, an optimized beam scanning region enables reduced shrinkage and improved measurement accuracy. Furthermore, since the scanning is optimized depending on a pattern, unnecessary beam scanning is no longer needed, and a time required for acquiring an image is shortened. Therefore, it is also possible to realize high throughput (high speed) required for an in-line SEM.

As illustrated in FIG. 14, as a mechanism for determining a scanning condition from pattern information 1401 ($\chi$) of an observation target, the control device 120 is internally equipped with a scanning condition conversion function preparation unit 1402 (unit that calculates a function Fs ($\chi$) from the pattern information ($\chi$)) and a scanning data preparation unit 1403. After being subjected to proper conversion (D/A conversion or amplification), an output of the scanning data preparation unit 1403 becomes a signal for scanning performed by a control system 1404 using a beam deflecting system 1405 (for example, the scanning deflector 105).

In order to obtain the pattern information ($\chi$), beam scanning in the scanning electron microscope is performed in two stages. The first stage is rough scanning, and the second stage is image scanning. In the rough scanning, an image is acquired using a low dose so as to acquire a pattern array (edge direction) and size information ($\chi$). The low dose is realized by high speed scanning, probe current changing, or combining both of these with each other. However, as described above, if the probe current is changed, an optical condition of the beam is also changed, thereby causing a possibility that it may take time to switch the rough scanning to the image scanning. Therefore, it is desirable to perform beam switching between the low dose and the high dose by switching the scanning speed.

Next, based on the direction of the pattern and the size information $\chi$, the scanning data (Fs($\chi$)) is prepared. The scanning data is input to the deflecting system, thereby performing the image scanning.

As the pattern information $\chi$, pattern data (template) can be used, and the rough scanning can be omitted. In this case, the template $\chi$ and the scanning data F($\chi$) corresponding thereto are recorded in a control unit in advance. In particular, when observation or measurement is performed using a recipe, a position of the observation pattern is specified by alignment and addressing, thereby performing the image scanning based on the template.

An image of the rough scanning and the image scanning can be generated using a desired signal electron. For example, the image of the rough scanning is generated using a secondary electron (SE) having low energy, and the image of the image scanning can be generated using a backscattered electron (BSE). A certain percentage of the SE image of the rough scanning is added to the BSE image acquired by the image scanning. In this manner, it is possible to emphasize an edge, for example. In general, as illustrated in FIG. 15, it is conceivable that the image scanning is performed based on rough scanning information $\chi$ 1501 and a certain percentage of the pattern information $\chi$ is added to the obtained image so as to generate a final image 1505. Hereinafter, an example will be described in which the pattern information $\chi$ is detected and the scanning data Fs($\chi$) is prepared.

As illustrated in FIG. 16, in a case where the pattern is a vertical line (a longitudinal direction of a pattern edge 1601 shows a pattern in a Y-direction), the direction of the image scanning is set to a direction perpendicular to the edge direction (Y). That is, in this case, the direction is set to a horizontal direction (scanning line 1602 in an X-direction). As the image scanning, the scanning data is conceivable in which scanning in the +X direction, scanning in the −X direction, or scanning in the +X and −X directions are alternately performed. In addition, the alternate scanning in the +X and −X directions includes scanning which reversely changes directions for each frame and scanning which reversely changes directions for each line of y-direction. The purpose of performing scanning by combining two ±X directions with each other is to prevent right and left edges from being asymmetrical with each other.

Since the rough scanning is performed using the low dose, an image having low SN is obtained. However, in order to accurately specify an edge from the image, a method of compressing the image and image processing for removing noise are used in combination with each other. As described above, as a result of acquiring the roughly scanned image, when it is determined that a beam scanning line direction for the rough scanning and a scanning line direction for the image scanning are the same as each other (if it is not necessary to change the scanning line direction when the rough scanning is switched to the image scanning), a signal at the time of the rough scanning may be incorporated as a portion of integration data of the captured image. In addition, even when the scanning line direction is changed, pixel signal of a necessary portion which are pixel signals in regions superimposed before and after the rotation in the scanning direction may be selectively integrated.

According to the above-described configuration, a properly set scanning direction can be realized while a beam irradiation amount is restrained.

Embodiment 8

As illustrated in FIG. 17, in a case where a horizontal (x-direction) pattern (pattern in which the longitudinal direction of a pattern edge 1701 is the X-direction) is specified by performing the rough scanning, scanning is performed by using a scanning line 1702 in the vertical (y) direction. In addition similarly to the vertical pattern, in order to improve symmetry of the upper and lower edges of the pattern, the image scanning is alternately performed in the ±direction.

Embodiment 9

As illustrated in FIG. 18, in a case where edges are detected in two directions in a field of view, the image scanning is alternately performed in the directions perpendicular to the respective edges. In the example in FIG. 18, an edge 1801 of a pattern A shows a direction of 45°, and an edge 1802 of a pattern B shows a direction of 0°. In this case, in order to clearly show the edge 1801 of the pattern A, scanning is performed using a scanning line 1803 in the direction of −45°. In order to clearly show the edge 1802 of the pattern B, scanning is performed using a scanning line

1804 in a direction of −90°. Furthermore, in order to improve symmetry of the both edges of the pattern, reciprocating scanning is performed in the above two directions.

Embodiment 10

An edge 1901 of a hole pattern as illustrated in FIG. 19 has edges in all directions of 0° to 360°. In this case, the image scanning is performed by setting the scanning direction to an interval of 90°/n. However, n is an integer of n=1, 2, 3, or more. In FIG. 19, scanning in the directions of 0° and 90° at n=1 (scanning using a scanning line 1902 in two directions) is alternately performed. In a case of n=2, the image scanning is performed in the directions of 0°, 45°, and 90°. In a direction having edges opposite to each other, in a case where the two edges are asymmetrical with each other due to charging, reciprocating scanning is performed in the direction.

In addition, as illustrated in FIG. 20, the rough scanning may be performed on a hole pattern 2001, and specified edges (2002 and 2003) may be selectively scanned with a beam having a high dose. In a case where a direction of a measurement target edge is specified, the rough scanning is performed on the measurement target edge by means of beam scanning so that a scanning line is formed in the direction perpendicular to the measurement target edge. In this manner, it is possible to accurately specify a position serving as the measurement target.

Embodiment 11

As illustrated in FIG. 21, in a case where two patterns are detected in a field of view by performing the rough scanning, only a region having the patterns is scanned in the direction perpendicular to the pattern edge. A region including a pattern A2101 is scanned using a scanning line A2103 in the X-direction, and a region including a pattern B2102 is scanned using a scanning line B2104 in the Y-direction. Charging can be reduced and damage to the sample can be reduced by limiting the scanning region to a portion of the measurement target pattern. In addition, since the scanning region is narrowed, a time for imaging can be shortened, and high throughput can be achieved.

Embodiment 12

In addition, in a case where there is only one pattern as illustrated in FIG. 22, an image is captured by scanning only a region having the pattern in the direction perpendicular to the pattern edge.

Embodiment 13

In a case where the same patterns are periodically arrayed, a template of periodical patterns is prepared in order to selectively scan the plurality of pattern portions, and a position specified by template matching is selectively scanned. In this manner, a dose amount can be restrained, and necessary information can be acquired. The template matching is performed by an image processing device incorporated in the control device 120. The template is stored in a predetermined storage medium inside the control device 120.

In a case of this example, the template which is n-times (n=real number) a pattern area is prepared. The scanning deflector 105 is controlled so as to scan a region superimposed on the template with the beam.

As illustrated in the example in FIG. 23, a template 2301 is prepared in advance so that a scanning width is set to horizontally K1$x$ and is set to vertically K2$y$ for a pattern of a horizontal width x and a vertical width y. In a case of a rough image as illustrated in FIG. 23($b$), 5 periodical patterns are present. Accordingly, 5 image scanning regions 2302 can be specified from the rough image by the template matching. Beam scanning is selectively performed on the specified regions (rough image regions superimposed on the template). In this manner, unnecessary scanning can be restrained, and the region including the measurement target pattern can be measured using an image whose S/N is high. A pattern 2303 includes edges in the vertical direction and the horizontal direction. Accordingly, scanning in the vertical direction (scanning for clearly showing the edge in the horizontal direction) and scanning in the horizontal direction (scanning for clearly showing the edge in the vertical direction) are alternately performed on the respective scanning regions. In this manner, it is possible to accurately evaluate a shape of the pattern 2303.

Embodiment 14

In a case of a two-dimensional pattern, there is a possibility that an edge parallel to the rough scanning direction cannot be detected due to the charging influence. In order to avoid this possibility, the rough scanning is performed with a low dose in two directions which are perpendicular to each other. As illustrated in FIG. 20, in a case where the rough scanning is performed on the hole pattern 2001 in the x-direction and the y-direction, an edge such as an edge 2002 in FIG. 20($b$) is detected in which the vertical direction is further relatively emphasized than the horizontal direction by the x-scanning, and an edge such as an edge 2003 in FIG. 20($c$) is detected in which the horizontal direction is further relatively emphasized than the vertical direction by the y-scanning. Based on two results thereof, it is possible to determine that the observation target is circular.

Embodiment 15

According to the present embodiment, a pattern is detected during the rough scanning, and depending on the presence or absence of an edge, a scanning speed is changed during the image scanning. A region having no edge is scanned at a high speed, and the periphery including the edge is scanned at a relatively low speed. The purpose of setting the slow scanning speed is to increase an incident dose and to improve SN. A time for imaging can be shortened by scanning a region which is not a measurement target at the high speed. In addition, in a case of a sample which is likely to be damaged, shrinkage is reduced.

As illustrated in FIG. 24($a$), the pattern is detected during the rough scanning. Based on an edge detection process, the pattern is divided into a pattern region (B) and a region (A) which is not the pattern region (B) as illustrated in FIG. 24($b$). As the pattern region, the front and rear portions of the edge are allowed to have a width of n % of the edge width. However, n is n=real number. FIG. 24($c$) illustrates an x-scanning waveform in a case where the pattern in FIG. 24 is imaged by the x-scanning. If an inclination in the region having no pattern is set to θ and an inclination in the region having the pattern is set to α, a relationship of θ>α is satisfied.

In addition, FIG. 24($d$) illustrates an example in which an irradiation dose is changed depending on the presence or absence of the pattern. An irradiation current is decreased in the region A, and an irradiation current is increased in the region B having the pattern.

Embodiment 16

When measuring the vertical (y) line pattern which is likely to receive damage due to the electron beam irradiation, in order to reduce shrinkage, a method is employed in which the x-scanning is performed at a certain interval in the y-direction. As illustrated in FIG. 25(a), however, in a case where the vertical line pattern is discontinuous in the y-direction, there is a possibility that a location having no pattern may be scanned. In order to avoid this possibility, the discontinuous portion is specified during the rough scanning (FIG. 25(b)), and the interval in the y-direction is determined so as to avoid the portion (FIG. 25(c)).

Embodiment 17

In general, as illustrated in FIG. 26, data of the image scanning is prepared for any pattern so that the image scanning is always perpendicular to the pattern edge detected by the rough scanning. As described above, the beam used in selectively scanning the edge portion for the rough scanning is used in low speed scanning for the rough scanning.

REFERENCE SIGNS LIST

101 Electron Source
102 Lead Electrode
103 Electron Beam
104 Condenser Lens
105 Scanning Deflector
106 Objective Lens
107 Sample Chamber
108 Sample Stage
109 Sample
110 Electron
111 Secondary Electron
112 Conversion Electrode
113 Detector
120 Control Device

The invention claimed is:
1. A charged particle beam device comprising:
a scanning deflector that performs scanning with a charged particle beam discharged from a charged particle source;
a detector that detects a charged particle obtained based on the scanning with the charged particle beam; and
a control device that adjusts an irradiation condition of the charged particle beam in at least two ways, the control device configured to:
acquire a first image of a scanning region by measuring or inspecting a pattern formed on a sample, based on a signal obtained by scanning a first region on the sample with a first charged particle beam,
scanning a second region including the first region with a second charged particle beam whose dose amount is smaller than that of the first charged particle beam, specifying an edge portion of the pattern or a position of the pattern by comparing a luminance value or a contrast value of each pixel in an image formed from a signal obtained by scanning with the second charged particle beam, with a first predetermined threshold, and determining the first region and a scanning direction of the first charged particle beam, based on the specified edge portion of the pattern or the specified position of the pattern,
wherein a difference between luminance values or contrast values of adjacent pixels is calculated, and a pixel position of a background part is determined by comparing the difference with a second predetermined threshold,
wherein the control device includes a storage medium for storing a template including predetermined patterns that are arranged periodically, and
wherein, in the control device, template matching is performed between the template and specified patterns, and when the specified patterns are determined to be the patterns arranged periodically, a region overlapping with the template in the patterns is set as the first region,
after acquiring the first image, acquire a second image of the scanning region using a higher dose than that used in acquiring the first image, by determining a scanning sequence comprising scanning the first region, thereafter scanning a third region separated from the first region, and thereafter scanning the second region closer to the first region than the third region.

2. The charged particle beam device according to claim 1, wherein the pixel position of the background part is also calculated in a rightward direction from a maximum value of the signal to determine an edge width of the pattern.

3. The charged particle beam device according to claim 1, wherein the second region is determined by adding a constant value of luminance or contrast to a front side and a rear side of the first region.

4. The charged particle beam device according to claim 1, wherein the first region and the scanning direction of the first charged particle beam are determined also based on the determined pixel position of the background part.

5. The charged particle beam device according to claim 1, wherein a scanning speed of the second charged particle beam is faster than a scanning speed of the first charged particle beam.

6. The charged particle beam device according to claim 1, wherein the control device determines the first region so as to include the specified edge portion of the pattern or the specified position of the pattern.

7. The charged particle beam device according to claim 1, wherein a probe current of the second charged particle beam is smaller than a probe current of the first charged particle beam.

8. The charged particle beam device according to claim 1, wherein the detector includes a secondary electron detector for detecting a secondary electron and a back-scattered electron detector for detecting a back-scattered electron,
wherein the signal obtained by scanning with the first charged particle beam is a signal output from the back-scattered electron detector, and
wherein the signal obtained by scanning with the second charged particle beam is a signal output from the secondary electron detector.

9. The charged particle beam device according to claim 1, wherein the scanning direction of the first charged particle beam is perpendicular to the specified edge portion.

10. The charged particle beam device according to claim 9, wherein the scanning direction of the first charged particle beam includes a plurality of reciprocating directions perpendicular to the specified edge portion.

11. The charged particle beam device according to claim 1, wherein, when the pattern is a hole pattern, the scanning direction of the first charged particle beam is a radial direction from a center of the hole pattern to the edge portion.

12. The charged particle beam device according to claim 1, wherein, when two or more patterns are specified, the first region is set to be a vicinity region of each of the patterns.

13. The charged particle beam device according to claim 1, wherein the second region is scanned by the second charged particle beam in two directions perpendicular to each other.

14. The charged particle beam device according to claim 1, wherein the first charged particle beam scans a vicinity region of the edge portion of the pattern with a scanning speed slower than a scanning speed of the first charged particle beam scanning a region other than the vicinity region of the edge portion of the pattern.

15. The charged particle beam device according to claim 1, wherein, when the pattern includes a plurality of line patterns periodically arranged, a third region including all of the plurality of line patterns in the first region is selectively scanned with the first charged particle beam.

16. The charged particle beam device according to claim 1, wherein a fourth region, which is different from the first region, is scanned along with the first region, and a scanning sequence is determined based on a distance between the fourth region and the first region.

17. The charged particle beam device according to claim 1, further comprising:
openings with a plurality of sizes which limit passage of the first and second charged particle beams,
wherein the control device controls the openings such that an opening for the second charged particle beam is smaller than an opening for the first charged particle beam.

18. The charged particle beam device according to claim 1, wherein the template has an area of n times an area of the predetermined pattern where n is a real number.

\* \* \* \* \*